(12) United States Patent
Kurushima et al.

(10) Patent No.: US 11,891,554 B2
(45) Date of Patent: *Feb. 6, 2024

(54) PHOSPHOR, LIGHT-EMITTING DEVICE, ILLUMINATION DEVICE, IMAGE DISPLAY DEVICE, AND INDICATOR LAMP FOR VEHICLE

(71) Applicants: Mitsubishi Chemical Corporation, Tokyo (JP); NATIONAL INSTITUTE FOR MATERIALS SCIENCE, Tsukuba (JP)

(72) Inventors: Tomoyuki Kurushima, Tokyo (JP); Yuhei Inata, Tokyo (JP); Naoto Hirosaki, Ibaraki (JP)

(73) Assignees: Mitsubishi Chemical Corporation, Tokyo (JP); NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/192,417

(22) Filed: Mar. 29, 2023

(65) Prior Publication Data

US 2023/0287267 A1 Sep. 14, 2023

Related U.S. Application Data

(63) Continuation of application No. 17/931,641, filed on Sep. 13, 2022, now Pat. No. 11,655,416, which is a (Continued)

(30) Foreign Application Priority Data

Jan. 20, 2022 (JP) .................................. 2022-007317
Jan. 20, 2022 (JP) .................................. 2022-007319

(51) Int. Cl.
*C09K 11/77* (2006.01)
*H01L 33/50* (2010.01)
(Continued)

(52) U.S. Cl.
CPC .... *C09K 11/77346* (2021.01); *C09K 11/7706* (2013.01); *C09K 11/77348* (2021.01); (Continued)

(58) Field of Classification Search
CPC . H01L 33/504; H01L 33/58; C09K 11/77348; C09K 11/7706; C09K 11/77346; F21S 43/16
See application file for complete search history.

(56) References Cited

U.S. PATENT DOCUMENTS 7,052,152 B2 5/2006 Harbers et al.
9,139,763 B2 9/2015 Winkler et al.
(Continued)

FOREIGN PATENT DOCUMENTS

CN 105400513 3/2016
CN 110305661 10/2019
(Continued)

OTHER PUBLICATIONS

U.S. Appl. No. 18/192,687 (Year: 2023).*
(Continued)

*Primary Examiner* — Mark W Tornow
(74) *Attorney, Agent, or Firm* — Grüneberg and Myers, PLLC

(57) ABSTRACT

A phosphor having a favorable emission peak wavelength, narrow full width at half maximum, and/or high emission intensity is provided. Additionally, a light-emitting device, an illumination device, an image display device, and/or an indicator lamp for a vehicle having favorable color rendering, color reproducibility and/or favorable conversion effi- (Continued)

ciency are provided. The present invention relates to a phosphor including a crystal phase having a composition represented by a specific formula, and having a minimum reflectance of 20% or more in a specific wavelength region, in which the specific wavelength region is from the emission peak wavelength of the phosphor to 800 nm, and a light-emitting device comprising the phosphor.

8 Claims, 11 Drawing Sheets

Related U.S. Application Data continuation of application No. PCT/JP2022/031466, filed on Aug. 19, 2022.

(51) Int. Cl.
*F21V 9/30* (2018.01)
*F21S 43/16* (2018.01)
*F21W 103/20* (2018.01)
*H01L 33/60* (2010.01)

(52) U.S. Cl.
CPC ............... *F21S 43/16* (2018.01); *F21V 9/30* (2018.02); *H01L 33/504* (2013.01); *F21W 2103/20* (2018.01); *H01L 33/60* (2013.01)

(56) References Cited

U.S. PATENT DOCUMENTS

| | | | |
|---|---|---|---|
| 10,608,149 B2* | 3/2020 | Aoyagi | H01L 33/504 |
| 11,655,416 B1* | 5/2023 | Kurushima | C09K 11/7706 257/487 |
| 11,661,549 B1* | 5/2023 | Kurushima | C09K 11/77348 257/98 |
| 2003/0099858 A1 | 5/2003 | Duggal et al. | |
| 2004/0051111 A1 | 3/2004 | Ota et al. | |
| 2004/0135504 A1 | 7/2004 | Tamaki et al. | |
| 2006/0017041 A1 | 1/2006 | Tian et al. | |
| 2006/0022146 A1 | 2/2006 | Juestel et al. | |
| 2006/0061263 A1 | 3/2006 | Sakuma et al. | |
| 2007/0007494 A1 | 1/2007 | Hirosaki et al. | |
| 2007/0108896 A1 | 5/2007 | Hirosaki | |
| 2007/0194321 A1 | 8/2007 | Yamazaki et al. | |
| 2007/0194685 A1 | 8/2007 | Hirosaki | |
| 2007/0205712 A1 | 9/2007 | Radkov et al. | |
| 2008/0031797 A1 | 2/2008 | Xia et al. | |
| 2008/0258602 A1 | 10/2008 | Masuda et al. | |
| 2008/0296596 A1 | 12/2008 | Setlur et al. | |
| 2009/0014741 A1 | 1/2009 | Masuda et al. | |
| 2009/0021141 A1 | 1/2009 | Emoto et al. | |
| 2009/0072255 A1 | 3/2009 | Takahashi et al. | |
| 2009/0230419 A1 | 9/2009 | Lee et al. | |
| 2009/0267485 A1 | 10/2009 | Nagatomi et al. | |
| 2009/0284948 A1 | 11/2009 | Yamao et al. | |
| 2010/0061077 A1 | 3/2010 | Winkler et al. | |
| 2010/0181580 A1 | 7/2010 | Masuda | |
| 2010/0200874 A1 | 8/2010 | Shioi et al. | |
| 2010/0207139 A1 | 8/2010 | Winkler et al. | |
| 2010/0213489 A1 | 8/2010 | Kim et al. | |
| 2010/0289403 A1 | 11/2010 | Tamaki et al. | |
| 2011/0235309 A1 | 9/2011 | Miki et al. | |
| 2011/0255265 A1 | 10/2011 | Nammalwar et al. | |
| 2012/0037941 A1 | 2/2012 | Schmidt et al. | |
| 2012/0062106 A1 | 3/2012 | Okada et al. | |
| 2015/0123155 A1 | 5/2015 | Schmidt et al. | |
| 2015/0159085 A1 | 6/2015 | Izawa et al. | |
| 2015/0221843 A1 | 8/2015 | Choi et al. | |
| 2016/0244664 A1 | 8/2016 | Tucks et al. | |
| 2017/0250320 A1 | 8/2017 | Wakui et al. | |
| 2017/0294561 A1* | 10/2017 | Ikeda | H01L 33/56 |
| 2019/0088832 A1* | 3/2019 | Onuma | C09K 11/7734 |
| 2019/0100694 A1* | 4/2019 | Nishimata | H01L 24/49 |
| 2019/0177607 A1 | 6/2019 | Murazaki | |
| 2019/0194540 A1* | 6/2019 | Yoshida | H01L 33/504 |
| 2019/0300788 A1 | 10/2019 | Meng et al. | |
| 2021/0130689 A1 | 5/2021 | Akabane et al. | |
| 2023/0235221 A1 | 7/2023 | Kurushima et al. | |
| 2023/0250334 A1 | 8/2023 | Kurushima et al. | |

FOREIGN PATENT DOCUMENTS

| | | |
|---|---|---|
| EP | 2 009 078 | 12/2008 |
| EP | 2 209 869 | 5/2009 |
| EP | 2 364 341 | 5/2010 |
| JP | 2017-8130 | 1/2017 |
| JP | 2017-155209 | 9/2017 |
| JP | 6335884 | 5/2018 |
| JP | 6923804 | 8/2021 |
| KR | 2016-0061393 | 5/2016 |
| KR | 102255213 | 5/2021 |
| TW | 201817853 | 5/2018 |
| WO | 2009/065480 | 5/2009 |
| WO | 2010/056619 | 5/2010 |
| WO | 2010/119375 | 10/2010 |
| WO | 2019/188377 | 10/2019 |
| WO | 2022/080262 | 4/2022 |
| WO | 2022/080263 | 4/2022 |
| WO | 2022/080265 | 4/2022 |

OTHER PUBLICATIONS

Chen et al., "A promising red-emitting phosphor SrLiAl$_3$N$_4$:Eu$^{2+}$ for field emission displays", Journal of Alloys and Compounds, vol. 864, Article No. 158103, 2021, pp. 1-9.
Clarke et al., "New Calcium Germanium Nitrides: Ca$_2$GeN$_2$, Ca$_4$GeN$_4$, and Ca$_5$Ge$_2$N$_6$", Inorg. Chem., vol. 39, No. 12, 2000, pp. 2631-2634.
Clarke et al., "Synthesis and structure of βCa$_3$Ga$_2$N$_4$, a ternary nitride with two interpenetrating three dimensional nets", Journal of Alloys and Compounds, vol. 274, 1998, pp. 118-121.
Decision of Refusal dated Sep. 27, 2022, in Japanese Patent Application No. 2022-007319, with English translation 6 pages.
Decision of Refusal dated Sep. 27, 2022, in Japanese Patent Application No. 2022-007320, with English translation, 7 pages.
Decision of Refusal dated Oct. 4, 2022, in Japanese Patent Application No. 2022-007317, with English translation, 8 pages.
Decision of Refusal dated Oct. 4, 2022, in Japanese Patent Application No. 2022-007318, with English translation, 8 pages.
Fang et al., "Chemical Control of SrLi(Al$_{1-x}$Ga$_x$)$_3$N$_4$:Eu$^{2+}$ Red Phosphors at extreme conditions for Application in Light-Emitting Diodes", Chemistry of Materials, vol. 31, 2019, pp. 4614-4618.
Hu et al., "Preparation of Sr$_{1-x}$Ca$_x$LiAl$_3$N$_4$:Eu$^{2+}$ Solid Solutions and Their Photoluminescence Properties", Journal of the American Ceramic Society, vol. 99, No. 10, 2016, pp. 3273-3279.
Hunting et al., "The synthesis and structural characterization of the new ternary nitrides: Ca$_4$TiN$_4$ and Ca$_5$NbN$_5$", Journal of Solid State Chemistry, vol. 180, 2007, pp. 31-40.
International Search Report dated Sep. 20, 2022, in PCT/JP2022/031466, with English translation, 5 pages.
International Search Report dated Sep. 20, 2022, in PCT/JP2022/031467. with English translation, 7 pages.
Japanese Office Action dated Jul. 5, 2022, in Japanese Patent Application No. 2022-007319, with English translation, 8 pages.
Japanese Office Action dated Jul. 5, 2022, in Japanese Patent Application No. 2022-007320, with English translation, 10 pages.
Japanese Office Action dated Jul. 12, 2022, in Japanese Patent Application No. 2022-007317, with English translation, 10 pages.
Japanese Office Action dated Jul. 12, 2022, in Japanese Patent Application No. 2022-007318, with English translation, 10 pages.
Korean Search Report dated Jan. 12, 2023, in Korean Application No. 10-2022-7045597, with English translation, 14 pages.
Korean Search Report dated Jan. 12, 2023, in Korean Application No. 10-2022-7045598, with English translation, 13 pages.
Kurushima et al., U.S. Appl. No. 17/931,632, filed Sep. 13, 2022.

(56) References Cited

OTHER PUBLICATIONS

Park et al., "A Structural Comparison between a New Quaternary Nitride, $Ba_3GeMgN_4$, and Its Isostructural Sr analogue", Bull. Korean Chem. Soc., vol. 32, No. 1, 2011, pp. 353-355.

Park et al., "$Sr(Mg_3Ge)N_4$ and $Sr(Mg_2Ga_2)N_4$: New isostructural Mg-containing quaternary nitrides with nitridometallate anions of $^3\infty[(Mg_3Ge)N_4]^{2-}$ and $^3\infty[(Mg_2Ga_2)N_4]^{2-}$ in a 3D-network structure", Solid state sciences, vol. 10, No. 12, 2008, pp. 1846-1852.

Reckeweg et al., "Magnesium nitride chemistry", Journal of Alloys and Compounds, vol. 315, 2001, pp. 134-142.

Wang et al., "The composition, luminescence, and structure of $Sr_8[Si_4O_{12}]Cl_8:Eu^{2+}$", Materials Research Bulletin, vol. 36, 2001, pp. 2051-2057.

Written Opinion dated Sep. 20, 2022, in PCT/JP2022/031466, 4 pages.

Written Opinion dated Sep. 20, 2022, in PCT/JP2022/031467, 7 pages.

Yamane et al., "Synthesis and Crystal Structures of $Ca_4SiN_4$ and New Polymorph of $Ca_5Si_2N_6$", Inorganic Chemistry, vol. 52, 2013, pp. 5559-5563.

Zeuner et al., "$Li_2CaSi_2N_4$ and $Li_{Sr-Si2}N_4$—a Synthetic Approach to Three-Dimensional Lithium Nitridosilicates", Eur. J. Inorg. Chem, 2010, pp. 4945-4951.

U.S. Appl. No. 17/931,632, filed Sep. 13, 2022, Kurushima et al.

U.S. Office Action dated Jun. 16, 2023, in U.S. Appl. No. 18/192,687, 13 pages.

U.S. Office Action dated Jun. 20, 2023, in U.S. Appl. No. 18/192,690, 13 pages.

U.S. Office Action dated Jul. 20, 2023, in U.S. Appl. No. 18/192,776, 13 pages.

Taiwanese Office Action dated Jun. 5, 2023, in Taiwanese Patent Application No. 111141188, English translation, 10 pages.

U.S. Appl. No. 18/192,776, filed Mar. 30, 2023, 2023/0250334, Kurushima et al.

U.S. Appl. No. 18/192,690, filed Mar. 30, 2023, 2023/0235221, Kurushima et al.

\* cited by examiner

PHOSPHOR, LIGHT-EMITTING DEVICE, ILLUMINATION DEVICE, IMAGE DISPLAY DEVICE, AND INDICATOR LAMP FOR VEHICLE

CROSS-REFERENCE TO RELATED APPLICATIONS

This application is a continuation of U.S. application Ser. No. 17/931,641, filed Sep. 13, 2022, which is a continuation of International Application No. PCT/JP2022/031466, filed on Aug. 19, 2022, and claims the benefit of priority to Japanese Application No. 2022-007317, filed on Jan. 20, 2022, and to Japanese Application No. 2022-007319, filed on Jan. 20, 2022. The content of each of these applications is hereby incorporated by reference in its entirety.

BACKGROUND OF THE INVENTION

Field of the Invention

The present invention relates to a phosphor, a light-emitting device, an illumination device, an image display device, and an indicator lamp for a vehicle.

Description of the Related Art

In recent years, there has been a turn toward energy-saving, and demand for illumination and back lighting using LEDs is increasing. The LEDs used in these cases are white light-emitting LEDs in which a phosphor is arranged on an LED chip that emits light in a blue or near ultraviolet wavelength.

An LED using, on a blue LED chip, a nitride phosphor that emits red light and a phosphor that emits green light, with blue light from the blue LED chip as excitation light, has been used for this type of white light-emitting LED in recent years. Greater emission efficiency for LEDs is sought, and a phosphor having superior light emission characteristics even as a red phosphor and a light-emitting device comprising such a phosphor are desired.

As a red phosphor that is used in a light-emitting device, a KSF phosphor represented by the general formulas $K_2(Si, Ti)F_6$:Mn and $K_2Si_{1-x}Na_xAl_xF_6$:Mn (0<x<1), an S/CASN phosphor represented by the general formula (Sr, Ca)AlSiN$_3$:Eu, and the like are known examples, but the KSF phosphor is harmful as a Mn-activated compound and so a phosphor that is better for humans and the environment is sought. In addition, many S/CASN phosphors have comparatively broad full widths at half maximum (in other words. FWHM or spectral half peak width) of about 80 nm-90 nm and an emission wavelength region is likely to include a wavelength range with low relative luminous efficiency, and therefore in terms of improving conversion efficiency, a red phosphor with a narrower full width at half maximum is sought.

In addition, a phosphor represented by the composition formula $SrLiAl_3N_4$:Eu is disclosed in an embodiment in Patent Literature 1, for example, as a red phosphor that can be applied to recent light-emitting devices.

PATENT LITERATURE

[Patent Literature 1] Japanese Patent No. 6335884

SUMMARY OF THE INVENTION

Problems to be Solved by the Invention

However, the emission intensity of the phosphor described in Patent Literature 1 is unclear, and a phosphor with more favorable emission intensity and a light-emitting device with favorable conversion efficiency are sought.

In view of the above-noted problems, in an aspect, the present invention takes as an objective to provide a light-emitting device, an illumination device, an image display device, and an indicator lamp for a vehicle having favorable color rendering, color reproducibility and/or favorable conversion efficiency.

Solution to Problem

Upon thorough investigation, the present inventors have found that the above-noted problems may be resolved by using a phosphor that includes a crystal phase represented by a specific composition and also has a reflectance in a prescribed wavelength region or a difference or ratio between the reflectances in a plurality of prescribed wavelength regions that is a certain range, or by using a light-emitting device comprising the phosphor, and have perfected the present invention. Here, some non-limiting embodiments of the present invention are shown below.

<1> A light-emitting device comprising a phosphor,
in which the phosphor includes a crystal phase having a composition represented by formula [1] below, and
a minimum reflectance in a prescribed wavelength region of the phosphor is 20% or more, and the prescribed wavelength region is a region from an emission peak wavelength of the phosphor to 800 nm.

$$Re_xMA_aMB_bMC_cN_dX_e \qquad [1]$$

(In formula [1] above,
MA includes one or more elements selected from a group consisting of Sr, Ca, Ba, Na, K, Y, Gd, and La,
MB includes one or more elements selected from a group consisting of Li, Mg, and Zn,
MC includes one or more elements selected from a group consisting of Al, Si, Ga, In, and Sc,
X includes one or more elements selected from a group consisting of F, Cl, Br, and I,
Re includes one or more elements selected from a group consisting of Eu, Ce, Pr, Tb, and Dy, and
a, b, c, d, e, and x satisfy the following expressions, respectively.
0.7≤a≤1.3
0.7≤b≤1.3
2.4≤c≤3.6
3.2≤d≤4.8
0.0≤e≤0.2
0.0<x≤0.2)

<2> A light-emitting device comprising a phosphor,
in which the phosphor includes a crystal phase having a composition represented by formula [2] below, and
a minimum reflectance in a prescribed wavelength region of the phosphor is 20% or more, and the prescribed wavelength region is a region from an emission peak wavelength of the phosphor to 800 nm.

$$Re_xMA_aMB_b(MC'_{1-y}MD_y)_cN_dX_e \qquad [2]$$

(In formula [2] above,
MA includes one or more elements selected from a group consisting of Sr, Ca, Ba, Na, K, Y, Gd, and La, MB includes one or more elements selected from a group consisting of Li, Mg, and Zn, MC' is Al, MD includes one or more elements selected from a group consisting of Si, Ga, In, and Sc, X includes one or more elements selected from a group consisting of F, Cl, Br, and I, Re includes one or more elements selected from a group consisting of Eu, Ce, Pr, Tb, and Dy, and a, b, c, d, e, x, and y satisfy the following expressions, respectively.

$0.7 \leq a \leq 1.3$
$0.7 \leq b \leq 1.3$
$2.4 \leq c \leq 3.6$
$3.2 \leq d \leq 4.8$
$0.0 \leq e \leq 0.2$
$0.0 < x \leq 0.2$
$0.0 < y \leq 1.0$)

<3> The light-emitting device according to <1> or <2>, in which in formula [1] or formula [2], 80 mol % or more of MA is one or more elements selected from a group consisting of Sr, Ca, and Ba.

<4> The light-emitting device according to <1> or <2>, in which in formula [1] or formula [2], 80 mol % or more of MB is Li.

<5> The light-emitting device according to <1>, in which in formula [1], 80 mol % or more of MC is constituted by one or more elements selected from a group consisting of Al and Ga.

<6> The light-emitting device according to <5>, in which in formula [1], 80 mol % or more of MC is Al.

<7> The light-emitting device according to <2>, in which in formula [2], 80 mol % or more of MD is Ga.

<8> The light-emitting device according to <1> or <2>, in which in formula [1] or formula [2], 80 mol % or more of Re is Eu.

<9> The light-emitting device according to <1> or <2>, in which a space group of the crystal phase having a composition represented by formula [1] or formula [2] is P-1.

<10> The light-emitting device according to <1> or <2>, in which the phosphor has an emission peak wavelength in a range of 620 nm or more and 660 nm or less in an emission spectrum.

<11> The light-emitting device according to <1> or <2>, in which the phosphor has a full width at half maximum (FWHM) in an emission spectrum of 70 nm or less.

<12> The light-emitting device according to <1> or <2>, further comprising a yellow phosphor and/or a green phosphor.

<13> The light-emitting device according to <12>, in which the yellow phosphor and/or green phosphor include at least one of a garnet type phosphor, a silicate type phosphor, a nitride phosphor, and an oxynitride phosphor.

<14> The light-emitting device according to <1> or <2> comprising a first light emitter, and a second light emitter that emits visible light due to irradiation with light from the first light emitter, and the second light emitter comprises a phosphor that includes crystal phase having a composition represented by formula [1].

<15> An illumination device comprising the light-emitting device according to <14> as a light source.

<16> An image display device comprising the light-emitting device according to <14> as a light source.

<17> An indicator lamp for a vehicle comprising the light-emitting device according to <14> as a light source.

<18> A phosphor that includes a crystal phase having a composition represented by formula [1] below, and has a minimum reflectance in a prescribed wavelength region that is 20% or more, and the prescribed wavelength region is a region from an emission peak wavelength of the phosphor to 800 nm.

$$Re_xMA_aMB_bMC_cN_dX_e \quad [1]$$

(In formula [1] above,

MA includes one or more elements selected from a group consisting of Sr, Ca, Ba, Na, K, Y, Gd, and La, MB includes one or more elements selected from a group consisting of Li, Mg, and Zn, MC includes one or more elements selected from a group consisting of Al, Si, Ga, In, and Sc, X includes one or more elements selected from a group consisting of F, Cl, Br, and I, Re includes one or more elements selected from a group consisting of Eu, Ce, Pr, Tb, and Dy, and a, b, c, d, e, and x satisfy the following expressions, respectively.

$0.7 \leq a \leq 1.3$
$0.7 \leq b \leq 1.3$
$2.4 \leq c \leq 3.6$
$3.2 \leq d \leq 4.8$
$0.0 \leq e \leq 0.2$
$0.0 < x \leq 0.2$)

<19> A phosphor that includes a crystal phase having a composition represented by formula [2] below, and has a minimum reflectance in a prescribed wavelength region that is 20% or more, and the prescribed wavelength region is a region from an emission peak wavelength of the phosphor to 800 nm.

$$Re_xMA_aMB_b(MC'_{1-y}MD_y)_cN_dX_e \quad [2]$$

(In formula [2] above,

MA includes one or more elements selected from a group consisting of Sr, Ca, Ba, Na, K, Y, Gd, and La, MB includes one or more elements selected from a group consisting of Li, Mg, and Zn, MC' is Al, MD includes one or more elements selected from a group consisting of Si, Ga, In, and Sc, X includes one or more elements selected from a group consisting of F, Cl, Br, and I, Re includes one or more elements selected from a group consisting of Eu, Ce, Pr, Tb, and Dy, and a, b, c, d, e, x, and y satisfy the following expressions, respectively.

$0.7 \leq a \leq 1.3$
$0.7 \leq b \leq 1.3$
$2.4 \leq c \leq 3.6$
$3.2 \leq d \leq 4.8$
$0.0 \leq e \leq 0.2$
$0.0 < x \leq 0.2$
$0.0 < y \leq 1.0$)

<20> The phosphor according to <18> or <19>, in which in formula [1] or formula [2], 80 mol % or more of MA is one or more elements selected from a group consisting of Sr, Ca, and Ba.

<21> The phosphor according to <18> or <19>, in which in formula [1] or formula [2], 80 mol % or more of MB is Li.

<22> The phosphor according to <18>, in which in formula [1], 80 mol % or more of MC is constituted by one or more elements selected from a group consisting of Al and Ga.

<23> The phosphor according to <22>, in which in formula [1], 80 mol % or more of MC is Al.

<24> The phosphor according to <19>, in which in formula [2], 80 mol % or more of MD is Ga.

<25> The phosphor according to <18> or <19>, in which in formula [1] or formula [2], 80 mol % or more of Re is Eu.

<26> The phosphor according to <18> or <19>, in which a space group of the crystal phase having a composition represented by formula [1] or formula [2] is P-1.

<27> The phosphor according to <18> or <19> having an emission peak wavelength in a range of 620 nm or more and 660 nm or less in an emission spectrum.

<28> The phosphor according to <18> or <19>, in which the full width at half maximum (FWHM) in an emission spectrum is 70 nm or less.

Effect of the Invention

According to some embodiments of the present invention, a light-emitting device, an illumination device, an image display device, and/or an indicator lamp for a vehicle having favorable color rendering, color reproducibility, and/or favorable conversion efficiency can be provided.

DETAILED DESCRIPTION OF THE INVENTION

Figure 1:
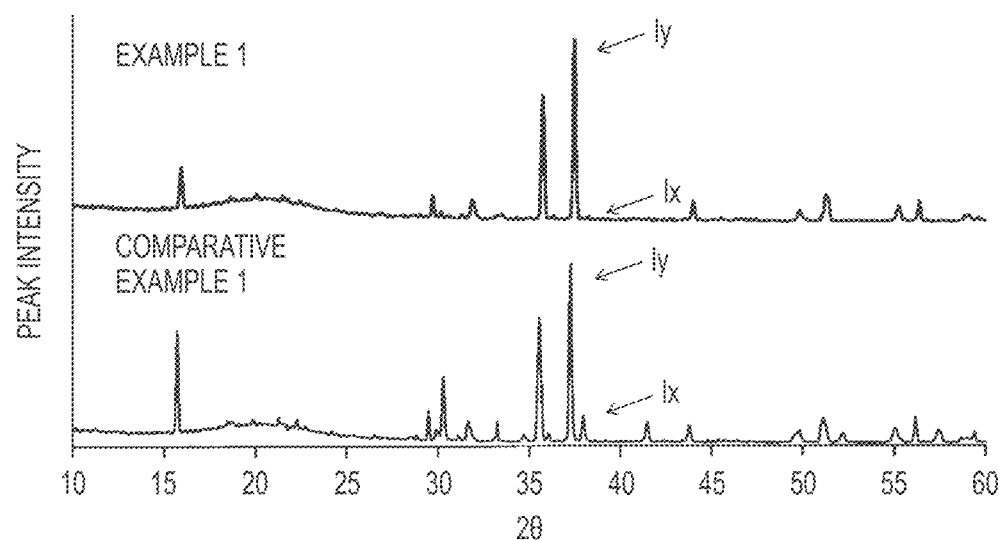
FIG. 1 shows XRD patterns of phosphors in example 1 and comparative example 1.

Hereafter, the present invention is described by way of embodiments and illustrative examples; however, the present invention is not limited to the following embodiments, illustrative examples, or the like, and can be implemented by making any desired modification within a scope that does not exceed the substance of the present invention.

Note that in the present specification, a numerical range represented using "–" signifies a range containing the numerical values noted before and after the "-" as a lower limit value and an upper limit value. In addition, for composition formulas of phosphors in the present specification, the end of each composition formula is represented by a comma (,). In addition, where a plurality of elements are listed separated by a comma (,), this indicates that one or two or more of the listed elements may be contained in any combination and composition. For example, the composition formula "(Ca, Sr, Ba)Al$_2$O$_4$:Eu" inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu", and "Ca$_{1-x-y}$Sr$_x$Ba$_y$Al$_2$O$_4$:Eu" (where 0<x<1, 0<y<1, and 0<x+y<1 in the formula).

<Phosphor>

In one embodiment, the present invention is a phosphor that includes a crystal phase having a composition represented by the following formula [1], and is a phosphor having a minimum reflectance in a wavelength region from the emission peak wavelength of the phosphor to 800 nm that is 20% or more (which hereafter may be referred to as "phosphor [1] of the present embodiment," and phosphor [1] of the present embodiment and a phosphor [2] of the present embodiment, described later, may collectively be referred to as "phosphors of the present embodiment"). In another embodiment, the present invention is a light-emitting device comprising the phosphor [1] of the present embodiment.

$$Re_xMA_aMB_bMC_cN_dX_e \qquad [1]$$

(In formula [1] above,

MA includes one or more elements selected from a group consisting of Sr, Ca, Ba, Na, K, Y, Gd, and La, MB includes one or more elements selected from a group consisting of Li, Mg, and Zn, MC includes one or more elements selected from a group consisting of Al, Si, Ga, In, and Sc, X includes one or more elements selected from a group consisting of F, Cl, Br, and I, Re includes one or more elements selected from a group consisting of Eu, Ce, Pr, Tb, and Dy, and a, b, c, d, e, and x satisfy the following expressions, respectively.

0.7≤a≤1.3
0.7≤b≤1.3
2.4≤c≤3.6
3.2≤d≤4.8
0.0≤e≤50.2
0.0<x≤0.2)

In formula [1], europium (Eu), cerium (Ce), praseodymium (Pr), neodymium (Nd), samarium (Sm), terbium (Tb), dysprosium (Dy), holmium (Ho), erbium (Er), thulium (Tm), and ytterbium (Yb), and the like can be used for Re, but in terms of improving emission wavelength and emission quantum efficiency, Re preferably includes one or more elements selected from a group consisting of Eu, Ce, Pr, Tb, and Dy, more preferably includes Eu, still more preferably 80 mol % or more of Re is Eu, and further still more preferably Re is Eu.

In formula [1], MA includes one or more elements selected from a group consisting of calcium (Ca), strontium (Sr), barium (Ba), sodium (Na), potassium (K), yttrium (Y), gadolinium (Gd), and lanthanum (La), preferably includes one or more elements selected from a group consisting of Ca, Sr, and Ba, and more preferably MA includes Sr. In addition, preferably, 80 mol % or more of MA is constituted by the above-noted preferred elements, and more preferably MA is constituted by the above-noted preferred elements.

In formula [1], MB includes one or more elements selected from a group consisting of lithium (Li), magnesium (Mg), and zinc (Zn), preferably includes Li, more preferably 80 mol % or more of MB is Li, and still more preferably MB is Li.

In formula [1], MC includes one or more elements selected from a group consisting of aluminum (Al), silicon (Si), gallium (Ga), indium (In), and scandium (Sc), preferably includes Al, Ga, or Si, more preferably includes one or more elements selected from a group consisting of Al and Ga, still more preferably 80 mol % or more of MC is constituted by one or more elements selected from a group consisting of Al and Ga, especially preferably 90 mol % or more of MC is constituted by one or more elements selected from a group consisting of Al and Ga, and most preferably MC is constituted by one or more elements selected from a group consisting of Al and Ga.

In one embodiment, 80 mol % or more of MC is Al, preferably 90 mol % or more, more preferably 95 mol % or more, and still more preferably 98 mol % or more. By 80 mol % or more of MC being Al, a red phosphor exhibiting a similar emission peak wavelength and emission intensity as existing red phosphors such as S/CASN and with a narrow full width at half maximum can be provided, and by using such a red phosphor, a light-emitting device can be provided that has superior color rendering or color reproducibility while maintaining conversion efficiency (1 m/W) similar to or better than the conventional.

In formula [1], N represents nitrogen. N may be partially substituted with oxygen (O) in order to maintain the charge balance of the overall crystal phase, or in order to adjust the emission peak wavelength.

In formula [1], X includes one or more elements selected from a group consisting of fluorine (F), chlorine (Cl), bromine (Br), and iodine (I). That is, in a specific embodiment, in terms of stabilization of a crystal structure and maintaining a charge balance for the entire phosphor, a portion of N may be substituted with the above-mentioned halogen elements represented by X.

Formula [1] includes cases where a component other than those specified above is included in trace amounts unavoidably, unintentionally, or deriving from trace additive components or the like.

Examples of a component other than those specified above include an element having an element number that is one different from an element that was intentionally added, an element of the same group as an element that was intentionally added, a rare earth element different from a rare earth element that was intentionally added, and a halogen element when a halogen compound was used for an Re raw material, an element that may generally be included in various other raw materials as an impurity, or the like.

An example of a case where a component other than those specified above is included unavoidably or unintentionally may be, for example, a case where the component derives from an impurity in the raw material and where the component is introduced in a manufacturing process such as a pulverization step or synthesis step. In addition, examples of the trace additive component may include a reaction assistant, Re raw material, and the like.

In formula [1] above, a, b, c, d, e, and x respectively indicate molar content of MA, MB, MC, N, X, and Re contained in a phosphor.

The value of a is ordinarily 0.6 or more, preferably 0.7 or more, more preferably 0.8 or more, and still more preferably 0.9 or more, and is ordinarily 1.4 or less, preferably 1.3 or less, more preferably 1.2 or less, and still more preferably 1.1 or less.

The value of b is ordinarily 0.6 or more, preferably 0.7 or more, more preferably 0.8 or more, and still more preferably 0.9 or more, and is ordinarily 1.4 or less, preferably 1.3 or less, more preferably 1.2 or less, and still more preferably 1.1 or less.

The value of c is ordinarily 2.1 or more, preferably 2.4 or more, more preferably 2.6 or more, and still more preferably 2.8 or more, and is ordinarily 3.9 or less, preferably 3.6 or less, more preferably 3.4 or less, and still more preferably 3.2 or less.

The value of d is ordinarily 3 or more, preferably 3.2 or more, more preferably 3.4 or more, still more preferably 3.6 or more, and even more preferably 3.8 or more, and is ordinarily 5 or less, preferably 4.8 or less, more preferably 4.6 or less, still more preferably 4.4 or less, and even more preferably 4.2 or less.

The value of e is not particularly limited, but is ordinarily 0 or more, and is ordinarily 0.2 or less, preferably 0.1 or less, more preferably 0.06 or less, still more preferably 0.04 or less, and even more preferably 0.02 or less.

The value of x is ordinarily a value greater than 0, preferably 0.0001 or more, and more preferably 0.001 or more, and is ordinarily 0.2 or less, preferably 0.15 or less, more preferably 0.12 or less, still more preferably 0.1 or less, and even more preferably 0.08 or less.

When the value of x is a value equal to or greater than the above-noted lower limit or higher than the above-noted lower limit, a phosphor having favorable emission intensity can be obtained, and when the value of x is equal to or less than the above-noted upper limit, Re can be favorably incorporated in a crystal and a phosphor can be obtained that readily functions as an emission center.

When b, c, d, and e are in the above-noted ranges, a crystal structure stabilizes. In addition, the values of d and e can be adjusted somewhat with the objective of maintaining a charge balance for the entire phosphor.

Also, when the value of a is in the above-noted range, a crystal structure stabilizes and a phosphor with few heterogeneous phases can be obtained.

The value of b+c is ordinarily 3.1 or more, preferably 3.4 or more, and more preferably 3.7 or more, and is ordinarily 4.9 or less, preferably 4.6 or less, and more preferably 4.3 or less.

When the value of b+c is in the above-noted range, a crystal structure stabilizes.

The value of d+e is ordinarily 3.2 or more, preferably 3.4 or more, and more preferably 3.7 or more, and is ordinarily 5.0 or less, preferably 4.6 or less, and more preferably 4.3 or less.

When the value of d+e is in the above-noted range, a crystal structure stabilizes.

When all values are in the above-noted ranges, the resulting phosphor has a favorable emission peak wavelength and full width at half maximum of an emission spectrum, which is preferred.

Note that a method of specifying an elemental composition of the phosphor is not particularly limited, and can be found with a routine method. For example, specification can be performed with GD-MS, ICP spectroscopy, an energy-dispersive X-ray spectrometer (EDX), or the like.

In one embodiment, the present invention is a phosphor that includes a crystal phase having a composition represented by the following formula [2], and is a phosphor having a minimum reflectance in a wavelength region from the emission peak wavelength of the phosphor to 800 nm that is 20% or more (which hereafter may be referred to as "phosphor [2] of the present embodiment").

In addition, in another embodiment, the present invention is a light-emitting device comprising the phosphor [2] of the present embodiment.

$$Re_xMA_aMB_b(MC'_{1-y}MD_y)_cN_dX_e \quad [2]$$

(In formula [2] above,

MA includes one or more elements selected from a group consisting of Sr, Ca, Ba, Na, K, Y, Gd, and La, MB includes one or more elements selected from a group consisting of Li, Mg, and Zn, MC' is Al, MD includes one or more elements selected from a group consisting of Si, Ga, In, and Sc, X includes one or more elements selected from a group consisting of F, Cl, Br, and I, Re includes one or more elements selected from a group consisting of Eu, Ce, Pr, Tb, and Dy, and a, b, c, d, e, x, and y satisfy the following expressions, respectively.

0.7≤a≤1.3
0.7≤b≤1.3
2.4≤c≤3.6
3.2≤d≤4.8
0.0≤e≤0.2
0.0<x≤0.2
0.0<y≤1.0)

The type and structure of the elements MA, MB, N, X, and Re in formula [2] can be configured similarly to formula [1].

MC' is Al.

MD includes one or more elements selected from a group consisting of Si, Ga, In, and Sc, and in terms of improving crystal stability and emission intensity, preferably includes one or more elements selected from a group consisting of Ga and Si, and more preferably includes Ga. and still more preferably 80 mol % or more of MD is Ga, and especially preferably MD is Ga.

The values and preferred ranges of a, b, c, d, e, and x in formula [2] can be configured similarly to formula [1].

The value of y in formula [2] is greater than 0.0, and is ordinarily 0.01 or more, preferably 0.015 or more, more preferably 0.03 or more, still more preferably 0.05 or more, and especially preferably 0.10 or more, and is ordinarily 1.00 or less, preferably 0.70 or less, more preferably 0.50 or less, still more preferably 0.30 or less, and especially preferably 0.25 or less.

When the value of y is equal to or greater than the lower limit, the emission peak wavelength of the phosphor is shortened, and by using such a phosphor, a light-emitting device can be provided having favorable color rendering or color reproducibility. In addition, when the value of y is equal to or less than the upper limit, a phosphor having favorable emission intensity can be obtained, and by using such a phosphor, a light-emitting device can be provided having favorable conversion efficiency. The value of y can be adjusted as appropriate in order to obtain the desired emission intensity and emission peak wavelength for an objective.

[Particle Size of Crystal Phase]

The particle size of the crystal phase of the phosphor according to the present embodiment is ordinarily 2 μm or more and 35 μm or less for a volume median particle size, the lower limit value is preferably 3 μm, more preferably 4 μm, and still more preferably 5 μm, and the upper limit value is preferably 30 μm or less, more preferably 25 μm or less, still more preferably 20 μm, and especially preferably 15 μm.

The volume median particle size being equal to or greater than the above-noted lower limit is preferable in terms of improving light emission characteristics the crystal phase exhibits in an LED package, and the volume median particle size being equal to or less than the above-noted upper limit is preferable in terms of the crystal phase being able to avoid obstructing a nozzle in an LED package manufacturing step.

The volume median particle size of the crystal phase of a phosphor can be measured with technique known to those skilled in the art, but in a preferable embodiment, for example, it can be measured with laser diffraction particle size analyzer. In this example, the volume median particle size (duo) is defined as the size of the particle when the cumulative number of particles which is counted sequentially from the smallest one becomes half of the total number.

[Phosphor Properties and the Like]

[Space Group]

A crystal system (space group) of the phosphor of the present embodiment is more preferably P-1. So long as a statistically average structure exhibits a repeating period of the above-noted length in a range that may be demarcated by powder X-ray diffraction or single crystal X-ray diffraction, the space group of the phosphor of the present embodiment is not particularly limited, but preferably belongs to #2, which is based on "International Tables for Crystallography (third, revised edition), Volume A, Space-group Symmetry".

With the above space group, a full width at half maximum (FWHM) in the emission spectrum becomes narrower and a phosphor having good emission efficiency can be obtained.

In this example, the space group can be found according to a routine method, for example with electron beam diffraction, X-ray diffraction structure analysis using powder or single crystal, neutron beam diffraction structure analysis, and the like.

When the intensity of a peak that appears in a region where 2θ=38–39° in a powder X-ray diffraction spectrum of the phosphor of the present embodiment is designated Ix and the intensity of a peak that appears in a region where 2θ=37-38° is designated Iy, the relative intensity Ix/Iy of Ix where Iy is treated as 1 is preferably 0.140 or less, more preferably 0.120 or less, still more preferably 0.110 or less, even more preferably 0.080 or less, especially preferably 0.060 or less, and most especially preferably 0.040 or less, and is ordinarily 0 or more, but the smaller the better.

The peak in the region where 2θ=37-38° is one characteristic peak that is observed when a crystal system (space group) is P-1, and when Iy is relatively high, a phosphor having greater P-1 phase purity can be obtained. By Ix/Iy being equal to or less than the above-noted upper limit, a phosphor has high phase purity and a narrow full width at half maximum (FWHM), and therefore emission efficiency of a light-emitting device improves.

[Reflectance in Specific Wavelength Region]

In one embodiment, the phosphor of the present embodiment has a minimum reflectance (hereafter also denoted as A %) in a prescribed wavelength region that is ordinarily 20% or more, and the prescribed wavelength region is a region from the emission peak wavelength of the phosphor to 800 nm. The minimum reflectance is preferably 25% or more, more preferably 30% or more, still more preferably 35% or more, especially preferably 50% or more, more especially preferably 60% or more, and extremely preferably 70% or more.

The upper limit of the reflectance is not particularly limited, but the higher the better, and is ordinarily 100% or less. When the reflectance is equal to or greater than the above-noted lower limit, a red phosphor having superior emission intensity or quantum efficiency can be provided, and by using such a phosphor, a light-emitting device having favorable conversion efficiency can be provided.

In one embodiment, the prescribed wavelength region associated with the reflectance A (%) of the phosphor of the present embodiment is a wavelength region from the emission peak wavelength to 800 nm. Reasons for selecting the above-noted wavelength region when stipulating the reflectance of the phosphor of the present embodiment are described below.

The present inventors have made the following findings:
1. A portion of the phosphors having a crystal phase represented by formula [1] or [2] above appear to have a slightly grayish cast when the body color of the phosphor in powder form was checked by eye under natural light in an unexcited state. In the present specification, this state may also be expressed as "dull" or having "dullness."
2. Among the phosphors having a crystal phase represented by formula [1] or [2] above, a phosphor having little of the above-noted "dullness" has superior emission intensity or quantum efficiency, and by using such a phosphor, a light-emitting device having favorable conversion efficiency can be provided.
3. Among the phosphors having a crystal phase represented by formula [1] or [2] above, a phosphor having little of the above-noted "dullness" tends to have high reflectance overall, and in particular is defined by reflectance to light in a specific wavelength band region, or defined by an index that includes reflectance to light in the specific wavelength band region, and can thereby be specified accurately.

Ordinarily, the specific wavelength region is preferably a wavelength belonging to a wavelength band region different from an excitation spectrum region.

From one vantage point, the specific wavelength region is preferably a wavelength in a wavelength region equal to or greater than the emission peak wavelength and equal to or less than an end portion of a long-wavelength side of the emission spectrum.

In a specific embodiment, a wavelength equal to or greater than the emission peak wavelength and equal to or less than 900 nm can ordinarily be selected as the specific wavelength region, and the upper limit is preferably 800 nm or less and more preferably 780 nm or less. As necessary, the wavelength region can occupy any wavelength region that is equal to or greater than the lower limit and equal to or less than the upper limit noted above.

The wavelength region of excitation spectrum of the phosphor of the present embodiment is primarily 300 nm-520 nm, but absorption may occur near 600 nm as well. In this example, it is inappropriate to define the body color of the phosphor based only on the reflectance of the wavelength region of the excitation spectrum because, in that case, the phosphor absorbs incident light and reflectance is influenced by the absorption rate.

From the above perspective, when defining the phosphor of the present embodiment by reflectance, the body color of the phosphor can be accurately defined by reflectance of the wavelength region that is little affected by absorption by the phosphor, or by employing a parameter related to this reflectance.

In one embodiment, for the phosphor of the present embodiment, when the minimum reflectance in a wavelength region from the emission peak wavelength Wp (nm) to [Wp−50](nm) is designated as B %, the value of [A−B] for the difference from the reflectance A (%) is preferably −1.5 points or more, more preferably 0.0 points or more, still more preferably 3.0 points or more, and especially preferably 4.0 points or more. The upper limit of [A−B] is not particularly limited, but is ordinarily 50.0 points or less.

When the value of [A−B] is equal to or greater than the above-noted lower limit, a phosphor having high emission intensity can be obtained, and by using such a phosphor, a light-emitting device having high conversion efficiency can be provided.

It is unclear why a phosphor with high emission intensity is obtained when [A−B] is a high value, but for example, there is no light absorption by the Re element (activator element) in a wavelength region equal to or higher than the emission peak wavelength associated with the reflectance A (%), and therefore absorptivity being low and reflectance being high may be considered desirable, while in turn, the reflectance B (%) shows absorption of light by the Re element (activator element) and the higher the absorptivity, the more reflectance is reduced. Therefore, it is possible that when the value of [A−B] is large, the activator element absorption of light contributing to emission is high and thus a phosphor having high emission intensity can be obtained. In this case, the wavelength regions associated with the reflectances A (%) and B (%) are consecutive, and therefore it is highly likely that A (%) and B (%) are comparatively close values, and as a result, defining the phosphor by comparison of A (%) and B (%), rather than B (%) alone, may be considered preferable.

In one embodiment, for the phosphor of the present embodiment, when the minimum reflectance in a wavelength region from 400 nm to 550 nm is designated as C %, the value of [A−C] for the difference from the reflectance A (%) is preferably 0.0 points or more, more preferably 2.0 points or more, still more preferably 5.0 points or more, especially preferably 10.0 points or more, more especially preferably 15.0 points or more, and extremely preferably 20.0 points or more. The upper limit of [A−C] is not particularly limited, but is ordinarily 50.0 points or less.

When the value of [A−C] is equal to or greater than the above-noted lower limit, a phosphor having high emission intensity can be obtained, and by using such a phosphor, a light-emitting device having high conversion efficiency can be provided.

In one embodiment, when the minimum reflectance in the wavelength region from 400 nm to 550 nm is designated as C %, the value of C/A for the ratio to the reflectance A (%) is preferably 1.05 or less, more preferably 1.00 or less, still more preferably 0.90 or less, especially preferably 0.80 or less, and more especially preferably 0.75 or less. The lower limit of C/A is not particularly limited, but is ordinarily 0.0 or more.

When the value of C/A is equal to or less than the above-noted upper limit, a phosphor having high emission intensity can be obtained, and by using such a phosphor, a light-emitting device having high conversion efficiency can be provided.

It is unclear why a phosphor with high emission intensity is obtained when [A−C] is a high value or C/A is a low value, but for example, there is very little absorption of light contributing to emission in a wavelength region equal to or higher than the emission peak wavelength associated with the reflectance A (%), and therefore absorptivity being low and reflectance being high may be considered desirable, while in turn, the wavelength region associated with the reflectance C (%) is a wavelength region that often uses blue light in an excitation light source, and the higher the absorptivity, the more reflectance is reduced. Therefore, it is possible that a phosphor with a low reflectance C (%) has high absorption of excitation light contributing to emission and thus a phosphor having high emission intensity can be obtained, or the like.

Note that, as may also be understood from the examples below, a phosphor with high absorption that does not contribute to emission due to impurities or the like tends to have reflectance that decreases overall in a broad wavelength region, and therefore from the above-noted perspective, when specifying a phosphor, defining the phosphor by comparison of A (%) and C (%), rather than C (%) alone, may be considered preferable.

[Emission Spectrum Characteristics]

The phosphor according to the present embodiment is excited by irradiating the phosphor with light having a suitable wavelength and gives off a red light exhibiting a favorable emission peak wavelength and full width at half maximum (FWHM) in the emission spectrum. Hereafter, the emission spectrum as well as an excitation wavelength, emission peak wavelength, and full width at half maximum (FWHM) are described.

(Excitation Wavelength)

The phosphor of the present embodiment has an excitation peak in a wavelength range of 270 nm or more ordinarily, preferably 300 nm or more, more preferably 320 nm or more, still more preferably 350 nm or more, and especially preferably 400 nm or more, and ordinarily 500 nm or less, preferably 480 nm or less, and more preferably 460 nm or less. That is, the phosphor is excited by light in a region from ultraviolet to blue.

Note that descriptions of the shape of the emission spectrum, as well as of the full width at half maximum and the emission peak wavelength below are applicable regardless of excitation wavelength, but in terms of improving quantum efficiency, irradiation with light having a wavelength in the above-noted range with good absorption and excitation efficiency is preferable.

(Emission Peak Wavelength)

The phosphor of the present embodiment has a peak wavelength in the emission spectrum of 620 nm or more ordinarily, preferably 625 nm or more, and more preferably 630 nm or more. In addition, the peak wavelength in the emission spectrum is ordinarily 670 nm or less, preferably 660 nm or less, and more preferably 655 nm or less.

When the peak wavelength in the emission spectrum of the phosphor is in the above-noted range, the color of the emitted light is a favorable red color, and by using this, a light-emitting device can be provided having good color rendering or color reproducibility. In addition, when the peak wavelength in the emission spectrum of the phosphor is equal to or lower than the above-noted upper limit, a light-emitting device can be provided having favorable luminous efficiency of the red color, and favorable luminous efficacy in 1 m/W.

Phosphors having different peak wavelengths according to usage can be used in the light-emitting device. A method for obtaining phosphors with different peak wavelengths is not particularly limited, and can be achieved by changing the configuration of the MC element, as an example of one method.

In one embodiment, a phosphor having a long emission peak wavelength can be obtained by using Al for MC in formula [1] and increasing the proportion of Al. In this embodiment, the emission peak wavelength is preferably 640 nm or more, and more preferably 645 nm or more, and is ordinarily 670 nm or less, and preferably 660 nm or less. By providing a phosphor with an emission wavelength in this range, a light-emitting device used for illumination, for example, can be provided that achieves both emission efficiency and color rendering, or a light-emitting device used in a backlight component of a liquid crystal display can be provided that achieves both emission efficiency and a color reproduction range.

In another embodiment, a phosphor can be obtained that has a relatively short emission peak wavelength by providing a phosphor that includes a crystal phase having a composition represented by formula [2] using MC' (Al) and an MD element. In this embodiment, the emission peak wavelength is ordinarily 615 nm or more, preferably 620 nm or more, more preferably 625 nm or more, and still more preferably 630 nm or more, and is ordinarily 660 nm or less, preferably 645 nm or less, and more preferably 640 nm or less. A light-emitting device having good color rendering or color reproducibility can be obtained by providing a phosphor having an emission wavelength in the above-noted range.

(Full Width at Half Maximum of Emission Spectrum)

The phosphor of the present embodiment has a full width at half maximum of the emission peak in the emission spectrum that is ordinarily 80 nm or less, preferably 70 nm or less, more preferably 60 nm or less, still more preferably 55 nm or less, and especially preferably 50 nm or less, and is ordinarily 10 nm or more.

A color reproduction range of an image display device such as a liquid crystal display can be broadened without reducing color purity by using the phosphor having the full width at half maximum of the emission peak within the above-noted range.

In addition, a phosphor having relatively high luminous efficiency of the emission wavelength region can be obtained by having the emission peak wavelength and the full width at half maximum equal to or less than the above-noted upper limits, and a light-emitting device having high conversion efficiency can be provided by using such a phosphor in a light-emitting device.

Note that a GaN type LED, for example, can be used to excite the phosphor with light of around 450 nm wavelength. In addition, the emission spectrum of the phosphor can be measured, and the emission peak wavelength, peak relative intensity, and peak full width at half maximum thereof be calculated, using a commercially-available spectrometry device such as a fluorescence spectrophotometer comprising a generic photodetector and a light source having an emission wavelength of 300-400 nm, such as a commercially available xenon lamp, for example.

<Method for Manufacturing Phosphor>

The phosphor of the present embodiment can be synthesized by mixing and heating raw materials of each element comprising the phosphor such that the proportions of each element fulfill formula [1] or [2].

[Raw Material]

The raw material of each element (MA, MB, MC, MC', MD, and Re) are not particularly limited, and examples may include the element alone, an oxide, a nitride, a hydroxide, a chloride, a halide such as fluoride, an inorganic salt such as sulfate, nitrate, or phosphate, an organic salt such as acetate, and the like. Besides these, a compound containing two or more of the element groups may be used. In addition, each compound may also be a hydrate or the like. Note that in the examples below, $Sr_3N_2$, $Li_3N$, AlN, GaN, and $EuF_3$ or $Eu_2O_3$ were used as starting materials.

A method of acquiring each of the raw materials is not particularly limited and can employ purchasing commercially available materials.

The purity of each of the raw materials is not particularly limited, but in terms of strict adherence to element ratios, and avoiding the occurrence of a heterogeneous phase due to an impurity, higher purities are more preferred, ordinarily 90 mol % or more, preferably 95 mol % or more, more preferably 97 mol % or more, and still more preferably 99 mol % or more, and the upper limit is not particularly limited, but is ordinarily 100 mol % or less, and impurities that are unavoidably mixed in may be included.

In the examples described below, raw materials all having 95 mol % purity or more were used.

The oxygen element (O), nitrogen element (N), and halogen element (X) can be supplied using an oxide, nitride, and halide or the like as the raw material for each of the elements, but can also be introduced by using an oxygen- or nitrogen-containing atmosphere during a synthesis reaction.

[Mixing Step]

The method of mixing the raw materials is not particularly limited and can employ a routine method. For example, phosphor raw materials are weighed so as to achieve a target composition and are sufficiently mixed using a ball mill or the like, obtaining a phosphor raw material mixture. The above mixing procedure is not particularly limited, but procedures (a) and (b) below are provided as specific examples.

(a) A dry mixing method that combines pulverization using a mortar and pestle, or a dry pulverizer such as a hammer mill, roll mill, ball mill, or jet mill, for example, and mixing using a mortar and pestle, or a mixer such as a ribbon blender, V blender, or Henschel mixer, for example, and pulverizes and mixes the above-noted phosphor raw materials.

(b) A wet mixing method in which a dispersion medium or a solvent such as water is added to the above-noted phosphor raw materials, the materials are mixed using a pulverizer, mortar and pestle, or evaporating dish and stirring rod, for example, and once rendered into a solution or slurry state, the materials are dried by spray drying, heat drying, air drying, or the like.

Mixing of the phosphor raw materials may be either the dry mixing method or wet mixing method noted above, but in order to avoid contamination of the phosphor raw materials by moisture, a dry mixing method or a wet mixing method using a non-aqueous solvent is preferred.

Note that the method of (a) was adopted in the examples described below.

[Heating Step]

In the heating step, for example, the phosphor raw material mixture obtained in the mixing step is placed in a crucible and is continuously heated at a temperature of 500° C.-1200° C., preferably 600° C.-1000° C., and more preferably 700-950° C.

The material of the crucible preferably does not react with the phosphor raw materials or a reaction product, and examples may include alumina, quartz, ceramics such as boron nitride, silicon carbide, and silicon nitride, metals such as nickel, platinum, molybdenum, tungsten, tantalum, niobium, iridium, and rhodium, or an alloy with these as a principal component, or the like.

Note that a boron nitride crucible was used in the examples described below.

Heating is preferably performed in an inert atmosphere, and can use a gas with nitrogen, argon, helium, or the like as a principal component. Note that heating was carried out in a nitrogen atmosphere in the examples described below.

In the heating step, in the above-noted temperature zone, heating is carried out ordinarily for 10 minutes-200 hours, preferably 1-100 hours, and more preferably 3-50 hours. In addition, the heating step may be performed one time or may be performed multiple times. Examples of an aspect in which the heating is performed multiple times may include an aspect including an annealing step by heating the phosphor under pressure in order to repair defects, an aspect in which primary heating obtaining primary particles or an intermediate product is performed, after which secondary heating obtaining secondary particles or a final product is performed, or the like.

The phosphor of the present embodiment is obtained in this way.

[Selection of Phosphor]

The phosphor of the present embodiment can generally be obtained with the above method, but sometimes the phosphor particles partially contain such ones that deviate slightly from the preferred properties due to slight differences such as minute accretion within a reaction vessel, impurities in the various reagents, the lot of the various raw material reagents, and the like, and there are cases where phosphors with large and small particle sizes, phosphors with different reflectance or the like, and the like are mixed together.

Therefore, the phosphor of the present embodiment can be obtained reliably by, for example, changing a number of conditions to manufacture a phosphor, selecting the resulting phosphor by classification, washing, and the like, analyzing the reflectance, XRD spectrum, and the like, and selecting a phosphor satisfying the requirements of above embodiments.

<Light-Emitting Device>

In one embodiment, the present invention is a light-emitting device that includes a first light emitter (excitation light source) and a second light emitter that emits visible light due to irradiation with light from the first light emitter, the light-emitting device including, as the second light emitter, the phosphor of the present embodiment which includes a crystal phase having a composition represented by formula [1] or [2] above. In this example, one kind of second light emitter may be used singly, or two or more kinds may be used together in any combination and ratio.

As the second light emitter, the light-emitting device of the present embodiment comprises the phosphor of the present embodiment which includes a crystal phase having a composition represented by formula [1] or [2] above, but also can use a phosphor that emits fluorescence from yellow through green and red (orange through red) regions under irradiation with light from the excitation light source.

In a specific embodiment, the light-emitting device of the present invention comprises a phosphor including a crystalline phase having a composition represented by the formula [1] or [2] above and further comprising a yellow phosphor and/or green phosphor.

Specifically, when configuring a light-emitting device, a phosphor having an emission peak in a wavelength range of 550 nm or more and 600 nm or less is preferred as a yellow phosphor, and a phosphor having an emission peak in a wavelength range of 500 nm or more and 560 nm or less is preferred as a green phosphor. In addition, an orange through red phosphor has an emission peak in a wavelength range that is ordinarily 615 nm or more, preferably 620 nm or more, more preferably 625 nm or more, and still more preferably 630 nm or more, and is ordinarily 660 nm or less, preferably 650 nm or less, more preferably 645 nm or less, and still more preferably 640 nm or less.

A light-emitting device exhibiting superior color reproducibility can be provided by appropriately combining phosphors with the above-noted wavelength regions. Note that an excitation light source having an emission peak in a wavelength range less than 420 nm may be used.

Hereafter, an aspect of the light-emitting device is described in a case where, as the red phosphor, the light-emitting device uses the phosphor of the present embodiment having an emission peak in the wavelength range of 620 nm or more and 660 nm or less and including a crystal phase having a composition represented by formula [1] or [2] above, and uses a first light emitter having an emission peak in the wavelength range of 300 nm or more and 460 nm or less. However, the present embodiment is not limited to these.

In the above-noted case, the light-emitting device of the present embodiment can be configured as the following aspects (A), (B), or (C), for example.
  (A) An aspect using, as a first light emitter, a light emitter having an emission peak in a wavelength range of 300 nm or more and 460 nm or less and, as a second light emitter, using at least one kind of phosphor having an emission peak in a wavelength range of 550 nm or more and 600 nm or less (yellow phosphor) and the phosphor of the present embodiment that includes a crystal phase having a composition represented by [1] or [2] above.
  (B) An aspect using, as a first light emitter, a light emitter having an emission peak in a wavelength range of 300 nm or more and 460 nm or less and, as a second light emitter, using at least one kind of phosphor having an emission peak in a wavelength range of 500 nm or more and 560 nm or less (green phosphor) and the phosphor of the present embodiment that includes a crystal phase having a composition represented by [1] or [2] above.
  (C) An aspect using, as a first light emitter, a light emitter having an emission peak in a wavelength range of 300 nm or more and 460 nm or less and, as a second light emitter, using at least one kind of phosphor having an emission peak in a wavelength range of 550 nm or more and 600 nm or less (yellow phosphor), at least one kind of phosphor having an emission peak in a wavelength range of 500 nm or more and 560 nm or less (green phosphor), and the phosphor of the present embodiment that includes a crystal phase having a composition represented by [1] or [2] above.

A commercially available phosphor can be used as the green or yellow phosphor in the above aspects, and a garnet type phosphor, silicate type phosphor, nitride phosphor, oxynitride phosphor, and the like can be used, for example.

(Yellow Phosphor)

Examples of the garnet type phosphor that can be used for the yellow phosphor may include, for example, $(Y, Gd, Lu, Tb, La)_3(Al, Ga)_5O_{12}:(Ce, Eu, Nd)$, examples of the silicate type phosphor may include, for example, $(Ba, Sr, Ca, Mg)_2SiO_4:(Eu, Ce)$, examples of the nitride phosphor and oxynitride phosphor may include, for example, $(Ba, Ca, Mg)Si_2O_2N_2:Eu$ (SION type phosphor), $(Li, Ca)_2(Si, Al)_{12}(O, N)_{16}:(Ce, Eu)$ (α-sialon phosphor), $(Ca, Sr)AlSi_4(O, N)_7:(Ce,Eu)$ (1147 phosphor), $(La, Ca, Y, Gd)_3(Al, Si)_4N_{11}:(Ce, Eu)$ (LSN phosphor), and the like.

One kind of these may be used singly, or two or more kinds may be used in combination.

As a yellow phosphor, a garnet type phosphor is preferred for the above-noted phosphor, and of these, a YAG type phosphor represented by $Y_3Al_5O_{12}:Ce$ is most preferred.

(Green Phosphor)

Examples of the garnet type phosphor that can be used for the green phosphor may include, for example, $(Y, Gd, Lu, Tb, La)_3(Al, Ga)_5O_{12}:(Ce, Eu, Nd)$ and $Ca_3(Sc, Mg)_2Si_3O_{12}:(Ce, Eu)$ (CSMS phosphor), examples of the silicate type phosphor may include, for example, $(Ba, Sr, Ca, Mg)_3SiO_{10}:(Eu, Ce)$ and $(Ba, Sr, Ca, Mg)_2SiO_4:(Ce, Eu)$ (BSS phosphor), examples of the oxide phosphor may include, for example, $(Ca, Sr, Ba, Mg)(Sc, Zn)_2O_4:(Ce, Eu)$ (CASO phosphor), examples of the nitride phosphor and oxynitride phosphor may include, for example, $(Ba, Sr, Ca, Mg)Si_2O_2N_2:(Eu, Ce)$, $Si_{6-z}Al_zO_zN_{8-z}:(Eu, Ce)$ (β-sialon phosphor) ($0<z\leq1$), and $(Ba, Sr, Ca, Mg, La)_3(Si, Al)_6O_{12}N_2:(Eu, Ce)$ (BSON phosphor), and examples of the aluminate phosphor may include, for example, $(Ba, Sr, Ca, Mg)_2Al_{10}O_{17}:(Eu, Mn)$ (GBAM type phosphor), and the like.

One kind of these may be used singly, or two or more kinds may be used in combination.

(Red Phosphor)

The phosphor of the present embodiment that includes a crystal phase having a composition represented by formula [1] or [2] above is used as the red phosphor, but in addition to the phosphor of the present embodiment, another orange through red phosphor can be used such as, for example, a Mn activated fluoride phosphor, a garnet type phosphor, a sulfide phosphor, a nanoparticle phosphor, a nitride phosphor, or an oxynitride phosphor. For example, the following phosphors can be used as the other orange through red phosphor.

Examples of the Mn activated fluoride phosphor may include, for example, $K_2(Si, Ti)F_6:Mn$ and $K_2Si_{1-x}Na_xAl_xF_6:Mn$ ($0<x<1$) (collectively, KSF phosphors), examples of the sulfide phosphor may include, for example, $(Sr, Ca)S:Eu$ (CAS phosphor) and $La_2O_2S:Eu$ (LOS phosphor), examples of the garnet type phosphor may include, for example, $(Y, Lu, Gd, Tb)_3Mg_2AlSi_2O_{12}:Ce$, examples of the nanoparticle may include, for example, CdSe, and examples of the nitride or oxynitride phosphor may include, for example, $(Sr, Ca)AlSiN_3:Eu$ (S/CASN phosphor), $(CaAlSiN_3)_{1-x} \cdot (SiO_2N_2)_x:Eu$ (CASON phosphor), $(La, Ca)_3(Al, Si)_6N_{11}:Eu$ (LSN phosphor), $(Ca, Sr, Ba)_2Si_5(N, O)_8:Eu$ (258 phosphor), $(Sr, Ca)Al_{1+x}Si_{4-x}O_xN_{7-x}:Eu$ (1147 phosphor), $M_x(Si, Al)_{12}(O, N)_{16}:Eu$ (where M is Ca, Sr, or the like) (α-sialon phosphor), $Li(Sr, Ba)Al_3N_4:Eu$ (where the x above is, in all instances, $0<x<1$), and the like.

One kind of these may be used singly, or two or more kinds may be used in combination.

[Configuration of Light-Emitting Device]

The light-emitting device according to the present embodiment includes a first light emitter (excitation light source) and, as a second light emitter, uses at least the phosphor of the present embodiment that includes a crystal phase having a composition represented by formula [1] or [2] above. The configuration of the light-emitting device is not limited and can adopt a known device configuration as desired.

Examples of the device configuration and embodiments of the light-emitting device may include those described in Japanese Patent Laid-open Publication No. 2007-291352, for example. In addition, examples of the form of the light-emitting device may include cannonball, cup, chip-on-board, remote phosphor, or the like.

[Application of Light-Emitting Device]

Applications of the light-emitting device are not particularly limited, and the device can be used in various fields where an ordinary light-emitting device is used, but about the light-emitting device with high color rendering, among these, the device can be especially ideally used as a light source of an illumination device or an image display device.

In addition, the light-emitting device comprising a red phosphor having a favorable emission wavelength can also be used in a red indicator lamp for a vehicle, or in an indicator lamp for a vehicle that is white and includes the red.

[Illumination Device]

In one embodiment, the present invention can be configured as an illumination device comprising the light-emitting device as a light source.

In a case where the light-emitting device is applied to an illumination device, the specific configuration of the illumination device is not limited, and a light-emitting device such as those described above may be appropriately incorporated into a known illumination device and used. Examples can include, for example, a plane emission illumination device in which many light-emitting devices are lined up on a bottom surface of a holding case.

[Image Display Device]

In one embodiment, the present invention can be configured as an image display device comprising the light-emitting device as a light source.

In a case where the light-emitting device is used as a light source of an image display device, the specific configuration of the image display device is not limited, but use with a color filter is preferred. For example, when configuring a color image display device using a color liquid crystal display element as the image display device, an image display device can be formed by configuring the light-emitting device as a back light, and combining an optical shutter using a liquid crystal with a color filter having red, green, and blue pixels.

[Indicator Lamp for Vehicle]

In one embodiment, the present invention can be configured as an indicator lamp for a vehicle comprising the light-emitting device.

A light-emitting device used in an indicator lamp for a vehicle, in a specific embodiment, is preferably a light-emitting device radiating white light. In the light-emitting device radiating white light, light radiating from the light-emitting device preferably has a deviation duv (also known as "delta uv") from the blackbody radiation locus of a light color of −0.0200-0.0200 and a color temperature of 5,000 K or more and 30,000 K or less.

A light-emitting device used in an indicator lamp for a vehicle, in a specific embodiment, is preferably a light-emitting device radiating red light. In this embodiment, for example, the light-emitting device may absorb blue light irradiating from a blue LED chip and emit red to configure a red light indicator lamp for a vehicle.

The indicator lamp for the vehicle includes illumination provided to a vehicle with the objective of providing another vehicle, a person, or the like with some sort of indicator, such as a headlight, side light, rear light, blinker, brake light, or fog light of a vehicle.

EXAMPLES

Hereafter, some specific embodiments of the present invention are described as examples, but the present invention is not limited to the following so long as the substance of the present invention is not exceeded.

{Measurement Method}

[Powder X-ray Diffraction Measurement]

Powder X-ray diffraction (XRD) was precision measured with the powder X-ray diffraction device SmartLab 3 (manufactured by Rigaku Co., Ltd.).

Measurement conditions are noted below.

Using CuKα bulb

X-ray output=45 kV, 200 mA

Divergence slit=Automatic

Detector=High-speed 1D X-ray detector (D/teX Ultra 250)

Scan range 2θ=5-95°

Read width=0.02°

[Measuring Reflectance]

A reflectance spectra was measured with an ultraviolet and visible spectrophotometer (V-560, manufactured by JASCO Corporation) per the following measurement conditions. The minimum reflectance in a wavelength region from the emission peak wavelength to 800 nm was found, with a standard reflector made of foam resin-treated PTFE (Spectralon standard reflector, manufactured by Labsphere, Inc.) treated as 100%.

Light source: Deuterium arc lamp (190-350 nm)

: Tungsten iodine lamp (330-900 nm)

Measured wavelength range: 200-800 nm

Measurement interval: 0.5 nm

[Measuring Emission Spectrum]

The emission spectrum was measured with a fluorescence spectrophotometer F-4500 (manufactured by Hitachi High Technology Corporation) per the following measurement conditions.

Light source: Xenon lamp

Excitation wavelength: 455 nm

Measured wavelength range: 200-800 nm

Measurement interval: 0.2 nm

[Measuring Quantum Efficiency]

Quantum efficiency was measured with a quantum efficiency measurement system QE-2100 (manufactured by Ohtsuka Electronics Co., Ltd.) per the following measurement conditions.

Light source: Xenon lamp

Excitation wavelength: 455 nm

Measured wavelength range: 200-850 nm

Measurement interval: 0.5 nm

<Evaluating Phosphor Characteristics>

A red phosphor (examples 1-2) corresponding to the phosphor of the present embodiment that includes a crystal phase having a composition represented by formula [1] or [2] above was prepared by manufacturing a phosphor according to the phosphor manufacturing method described above and measuring the emission spectrum and reflectance, after which a phosphor with a minimum reflectance in the wavelength region from the emission peak wavelength to 800 nm that satisfies the requirements of the present invention is selected. In addition, a phosphor of comparative example 1 in which the minimum reflectance in the wavelength region from the emission peak wavelength to 800 nm is 17.74% was prepared as a comparison to the present invention.

Figure 2:
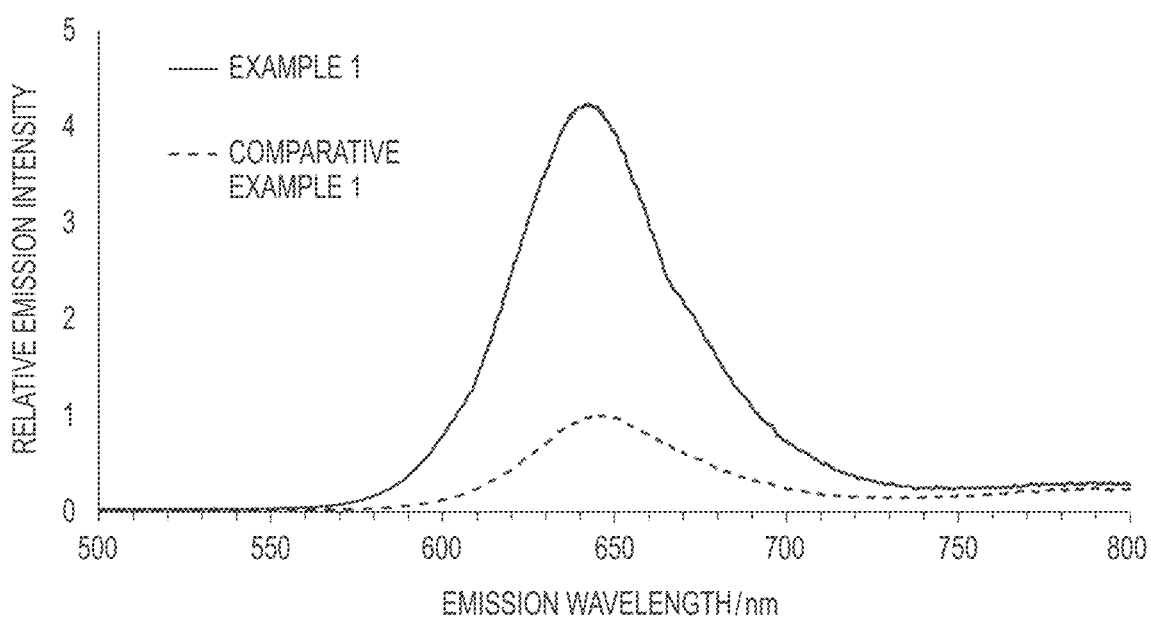
FIG. 2 shows emission spectra of the phosphors in example 1 and comparative example 1.

The composition, minimum reflectance in the wavelength region from the emission peak wavelength to 800 nm, emission peak wavelength, full width at half maximum, and relative emission intensity when the emission intensity of the phosphor of comparative example 1 is treated as 1 of each phosphor are shown in Table 1. In addition, the XRD patterns and emission spectra of the phosphors in example 1 and comparative example 1 are shown in FIGS. 1 and 2, respectively.

The space group of the phosphors of examples 1-2 was P−1 and the emission peak wavelength was near 644 nm. In addition, it can be seen that the full width at half maximum is favorable, at 54 nm and 57 nm respectively, and the emission intensity is greatly improved by several times or ten times or more compared to the phosphor of comparative example 1, and when applied to a light-emitting device, a light-emitting device having favorable conversion efficiency can be obtained.

[Table 1]

TABLE 1

|  | Composition | Ga/(Al + Ga) | Minimum reflectance from emission peak wavelength to 800 nm (%) | Emission peak wavelength/ nm | Full width half maximum/ nm | Relative emission intensity | iQE/% |
| --- | --- | --- | --- | --- | --- | --- | --- |
| Comparative example 1 | SrLi(Al,Ga)$_3$N$_4$:Eu | 0.17 | 17.74 | 646 | 55 | 1.0 | 2% |
| Example 1 | SrLi(Al,Ga)$_3$N$_4$:Eu | 0.17 | 37.95 | 642 | 54 | 4.2 | No data |
| Example 2 | SrLi(Al,Ga)$_3$N$_4$:Eu | 0.17 | 75.64 | 644 | 57 | 14.4 | 59% |
| Example 3 | SrLiAl$_3$N$_4$:Eu | 0.00 | 68.71 | 649 | 50 | 14.5 | 42% |
| Example 4 | SrLiAl$_3$N$_4$:Eu | 0.00 | 72.60 | 650 | 52 | 24.0 | 67% |
| Example 5 | SrLi(Al,Ga)$_3$N$_4$: Eu | 0.17 | 73.99 | 642 | 54 | 18.4 | 63% |
| Example 6 | SrLi(Al,Ga)$_3$N$_4$:Eu | 0.20 | 70.61 | 640 | 55 | 16.7 | 61% |
| Example 7 | SrLi(Al,Ga)$_3$N$_4$:Eu | 0.23 | 72.85 | 639 | 57 | 13.6 | 57% |
| Example 8 | SrLi(Al,Ga)$_3$N$_4$:Eu | 0.27 | 66.05 | 638 | 57 | 11.1 | 47% |
| Example 9 | SrLi(Al,Ga)$_3$N$_4$:Eu | 0.30 | 57.61 | 636 | 58 | 8.9 | 34% |
| Example 10 | SrLi(Al,Ga)$_3$N$_4$:Eu | 0.33 | 78.97 | 634 | 57 | 15.5 | 52% |
| Example 11 | SrLi(Al,Ga)$_3$N$_4$:Eu | 0.40 | 74.39 | 633 | 55 | 15.0 | 60% |
| Example 12 | SrLi(Al,Ga)$_3$N$_4$:Eu | 0.50 | 72.32 | 629 | 58 | 9.3 | 47% |

Next, phosphors in which the reflectance and the configuration of the MC element in formula [1] (or MD element in formula [2]) were variously modified (examples 3-12) were prepared. The composition, minimum reflectance in the wavelength region from the emission peak wavelength to 800 nm, emission peak wavelength, full width at half maximum, relative emission intensity when the emission intensity of comparative example 1 is treated as 1, and the internal quantum efficiency (iQE) of each example are shown in Table 1. Note that the space group was P−1 for all of examples 3-12. In addition, Table 2 shows the minimum reflectance in prescribed wavelength regions, and the difference or ratio between the minimum reflectances associated with each region.

In addition, a commercially available CASN phosphor (BR-1014J, manufactured by Mitsubishi Chemical Corporation) having a composition represented by CaAlSiN$_3$:Eu was prepared as reference example 1, showing an example of an existing phosphor. The space group of the phosphor of reference example 1 was Cmc2$_1$, the emission peak wavelength was 646 nm, and the full width at half maximum was 87 nm.

[Table 2]

TABLE 2

| | Reflectance A/% | Reflectance B/% | Reflectance C/% | A − B | A − C | C/A | Emission peak wavelength/ nm | Relative emission intensity |
|---|---|---|---|---|---|---|---|---|
| Comparative example 1 | 17.74 | 19.57 | 18.90 | −1.83 | −1.16 | 1.07 | 646 | 1.0 |
| Example 1 | 37.95 | 37.84 | 35.43 | 0.11 | 2.53 | 0.93 | 642 | 4.2 |
| Example 2 | 75.64 | 73.75 | 60.39 | 1.89 | 15.25 | 0.80 | 644 | 14.4 |
| Example 3 | 68.71 | 64.14 | 48.33 | 4.57 | 20.38 | 0.70 | 649 | 14.5 |
| Example 4 | 72.60 | 64.74 | 49.15 | 7.87 | 23.45 | 0.68 | 650 | 24.0 |
| Example 5 | 73.99 | 68.99 | 54.50 | 5.00 | 19.49 | 0.74 | 642 | 18.4 |
| Example 6 | 70.61 | 67.12 | 54.23 | 3.50 | 16.38 | 0.77 | 640 | 16.7 |
| Example 7 | 72.85 | 69.27 | 56.32 | 3.58 | 16.54 | 0.77 | 639 | 13.6 |
| Example 8 | 66.05 | 65.24 | 55.00 | 0.81 | 11.05 | 0.83 | 638 | 11.1 |
| Example 9 | 57.61 | 57.41 | 50.18 | 0.20 | 7.44 | 0.87 | 636 | 8.9 |
| Example 10 | 78.97 | 77.05 | 60.74 | 1.93 | 18.24 | 0.77 | 634 | 15.5 |
| Example 11 | 74.39 | 74.07 | 58.85 | 0.32 | 15.55 | 0.79 | 633 | 15.0 |
| Example 12 | 72.32 | 72.30 | 61.02 | 0.02 | 11.30 | 0.84 | 629 | 9.3 |

Figure 3:
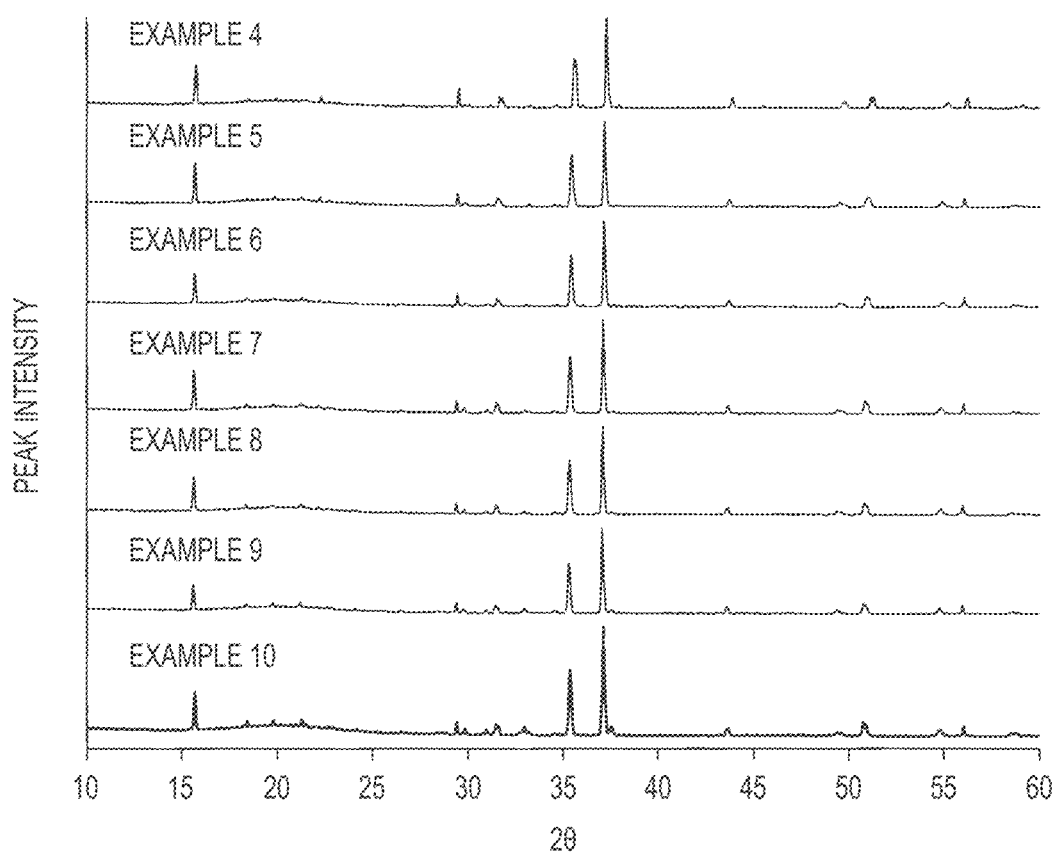
FIG. 3 shows XRD patterns of phosphors in examples 4-10.
Figure 4A:
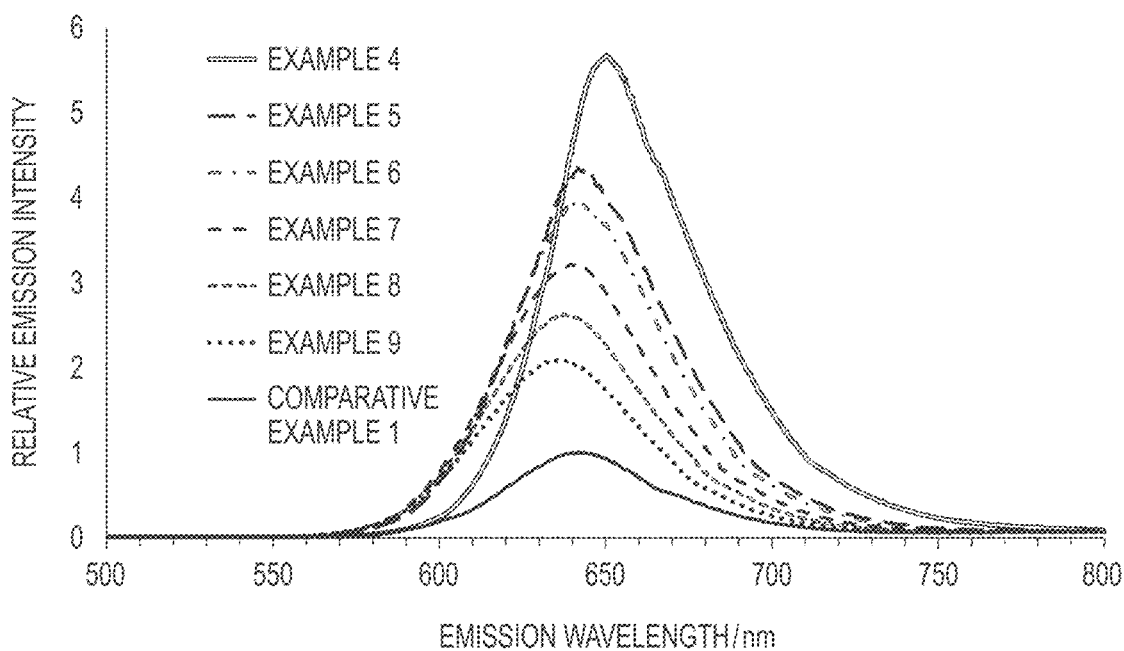
FIG. 4A shows emission spectra of the phosphors in comparative example 1 and examples 4-9.
Figure 4B:
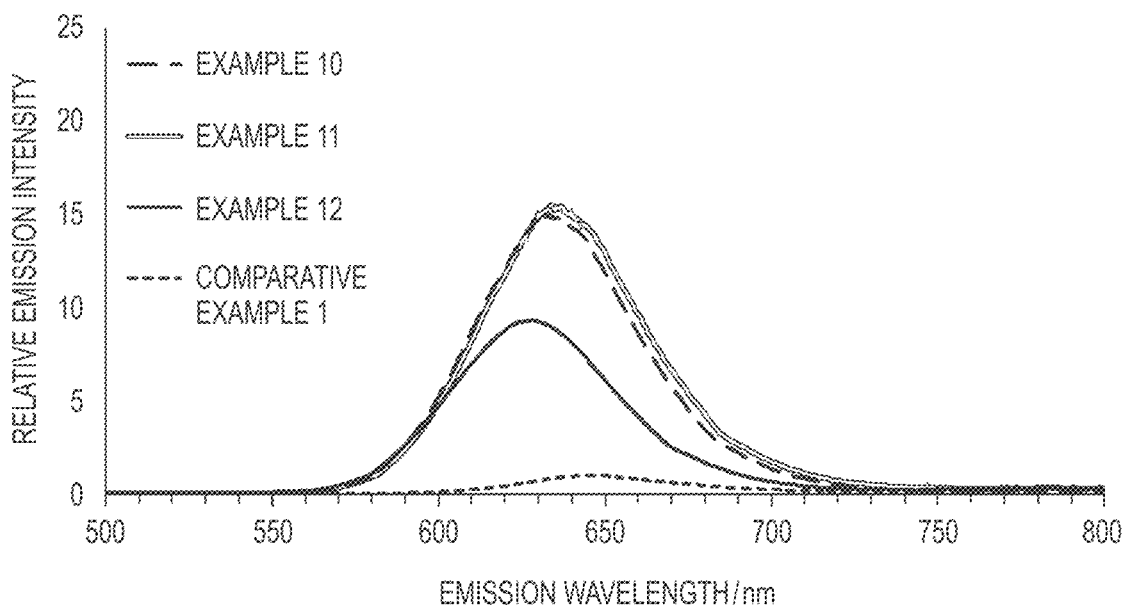
FIG. 4B shows emission spectra of the phosphors in comparative example 1 and examples 10-12.
Figure 5:
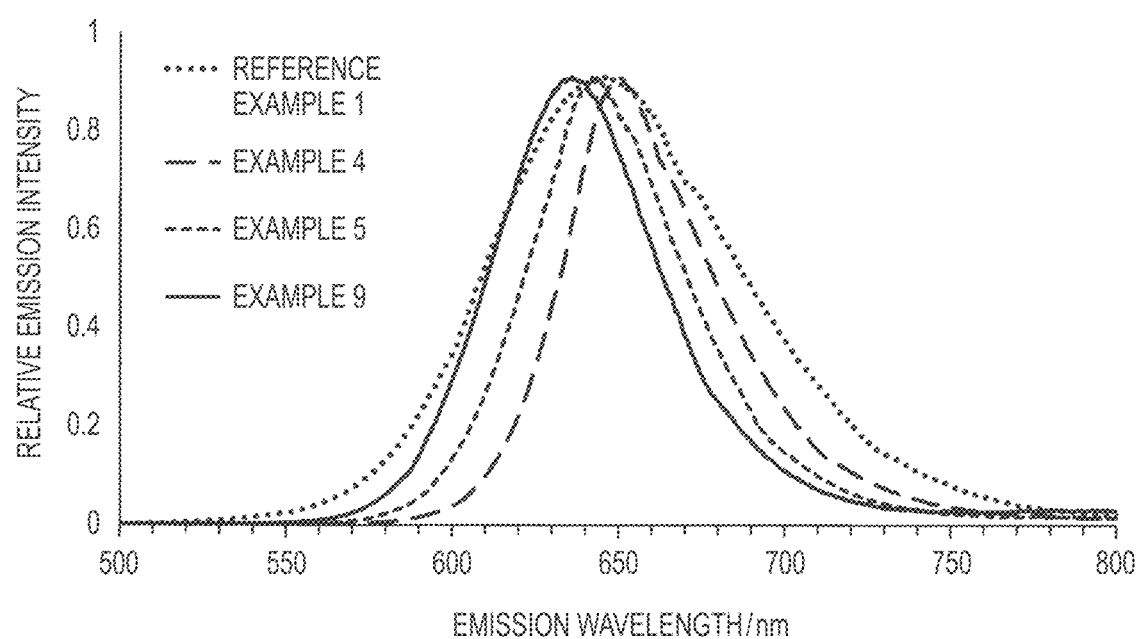
FIG. 5 shows normalized emission spectra of the phosphors in examples 4, 5, and 9 and reference example 1.
Figure 6A:
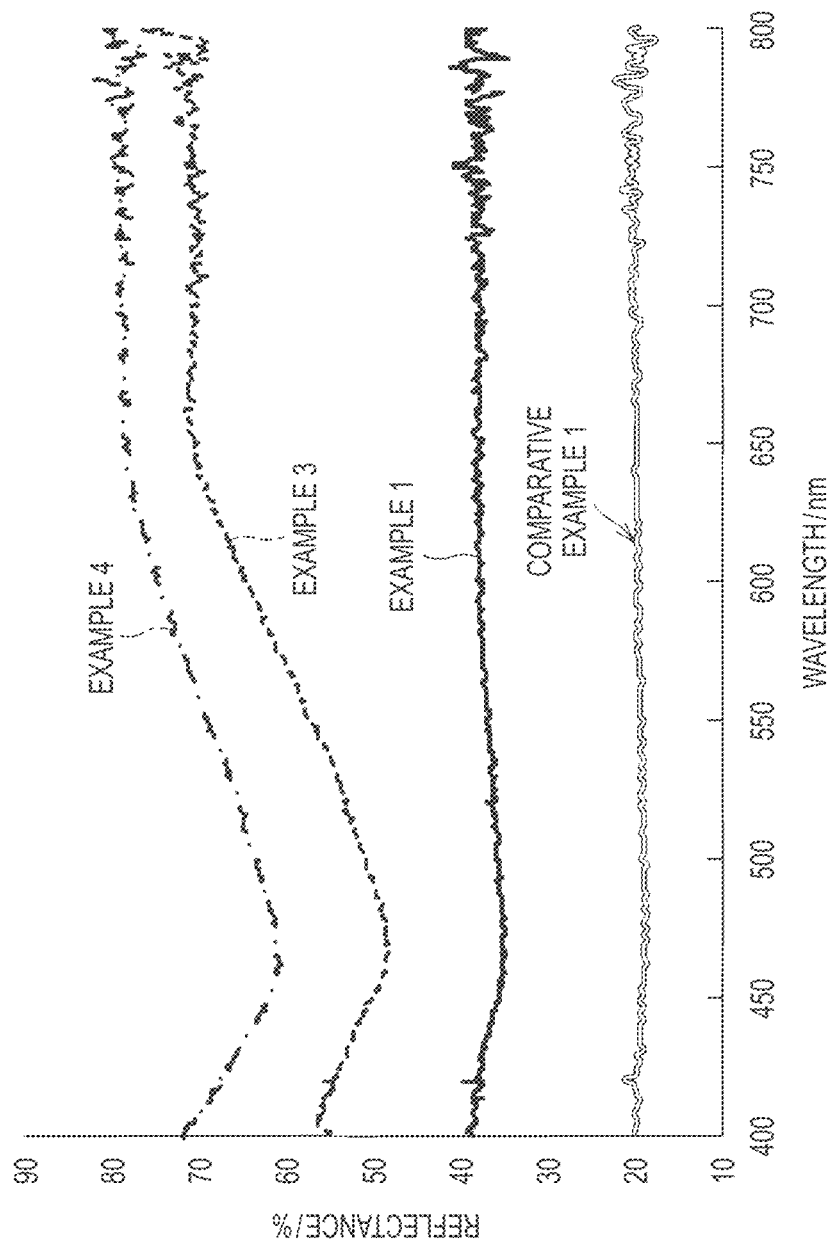
FIG. 6A shows reflectance spectra of the phosphors in each of the examples and the comparative example.
Figure 6B:
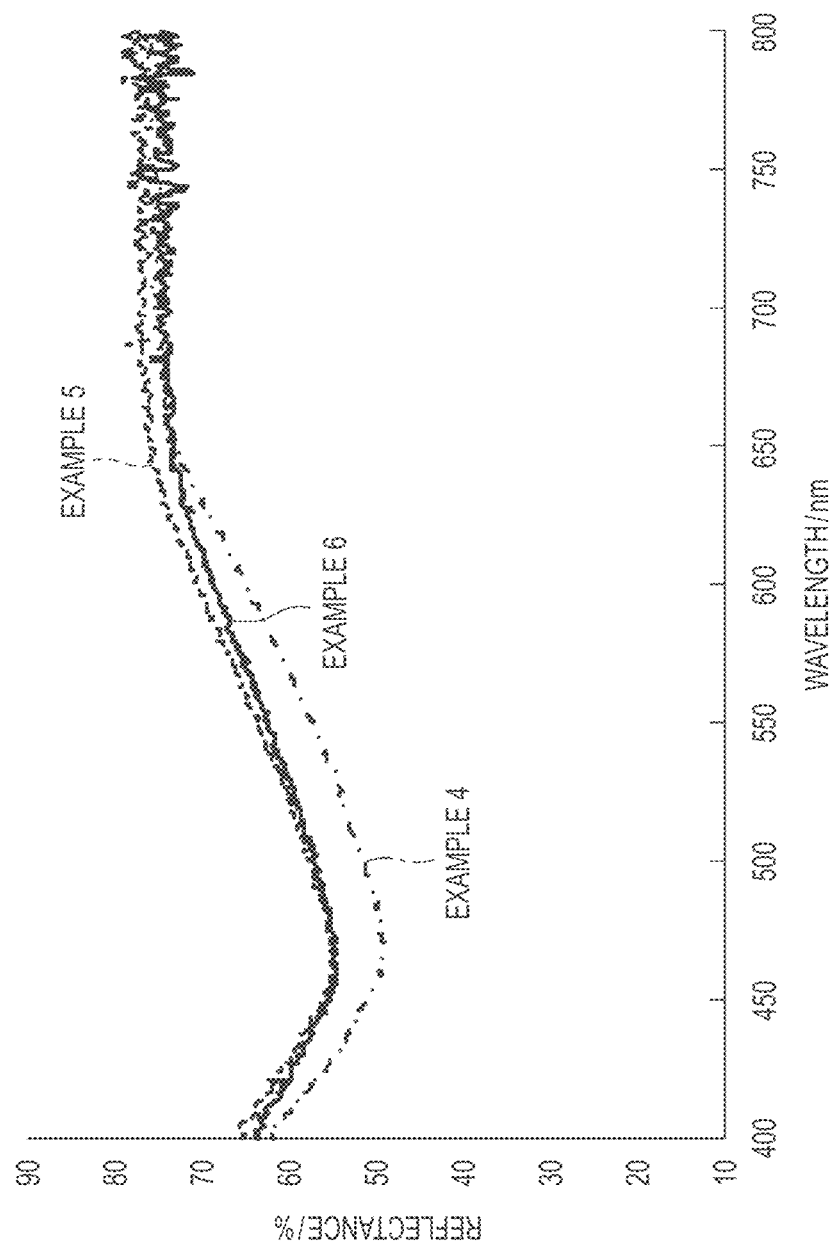
FIG. 6B shows reflectance spectra of the phosphors in each of the examples.
Figure 6C:
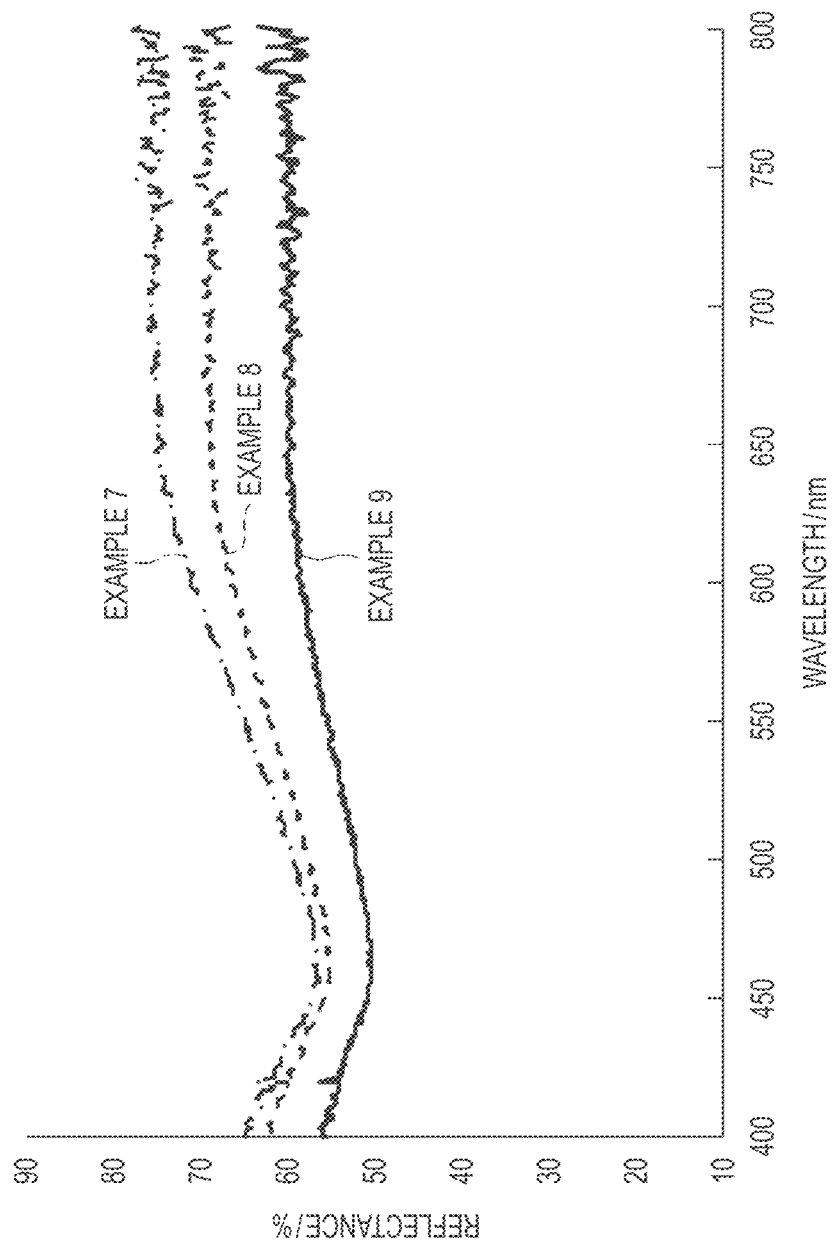
FIG. 6C shows reflectance spectra of the phosphors in each of the examples.
Figure 6D:
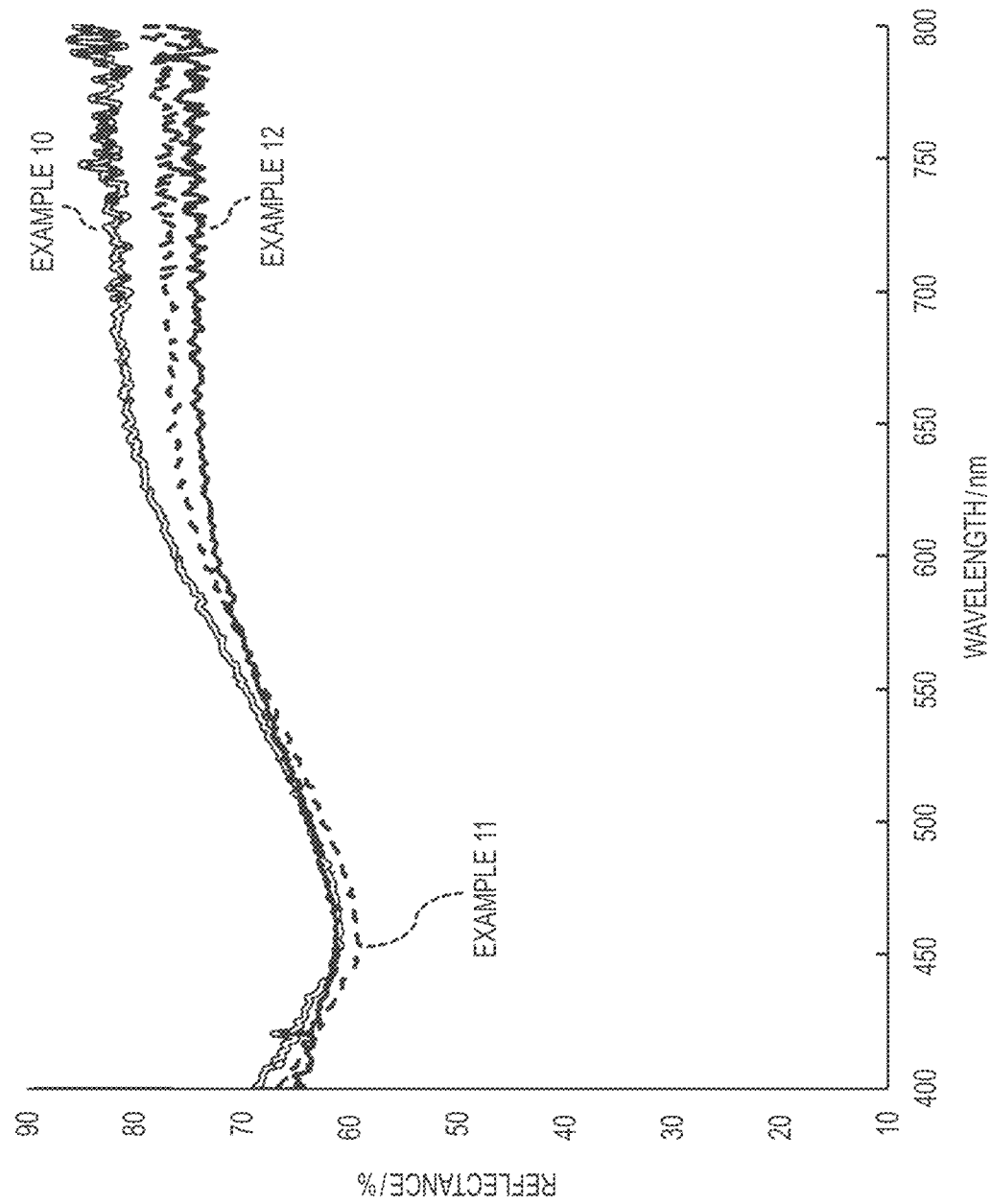
FIG. 6D shows reflectance spectra of the phosphors in each of the examples.
Figure 7A:
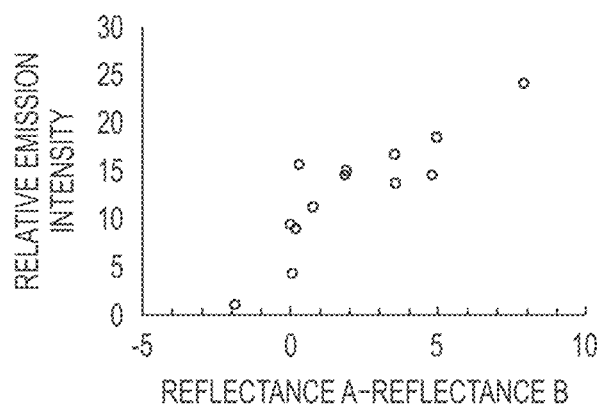
FIG. 7A illustrates a relationship between the relative emission intensity and a difference between the minimum reflectance in a plurality of specific wavelength regions.
Figure 7B:
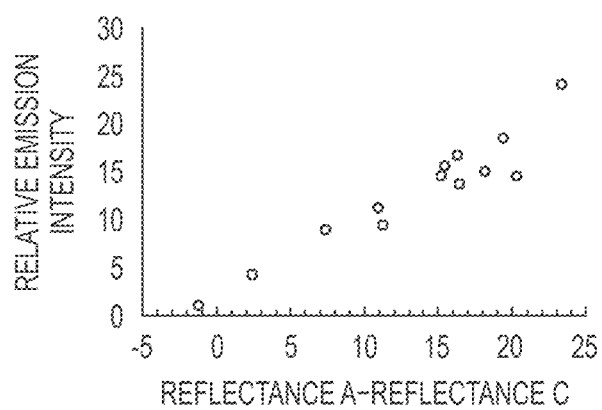
FIG. 7B illustrates a relationship between the relative emission intensity and a difference between the minimum reflectance in a plurality of specific wavelength regions.
Figure 7C:
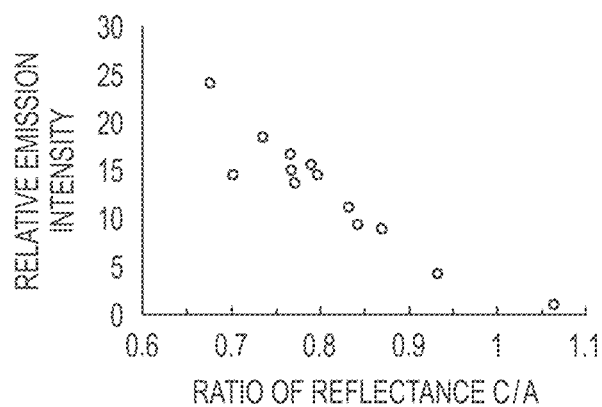
FIG. 7C illustrates a relationship between the relative emission intensity and a ratio between the minimum reflectance in a plurality of specific wavelength regions.
Figure 7D:
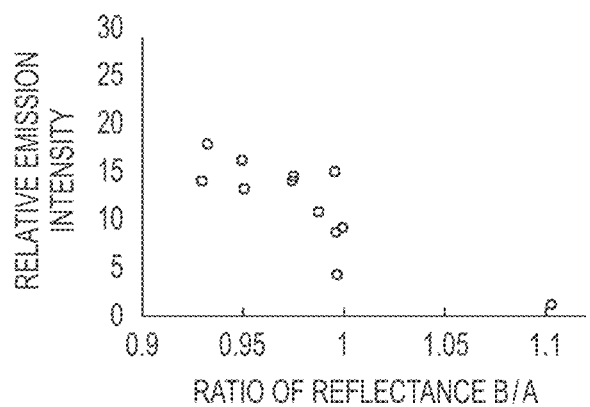
FIG. 7D illustrates a relationship between the relative emission intensity and a ratio between the minimum reflectance in a plurality of specific wavelength regions.
Figure 8A:
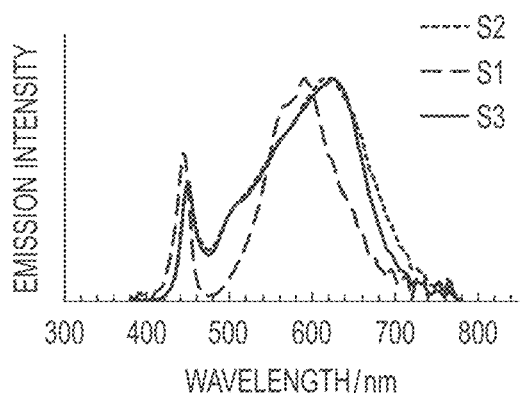
FIG. 8A shows charts illustrating simulated light emission characteristics of light-emitting devices in the examples.
Figure 8B:
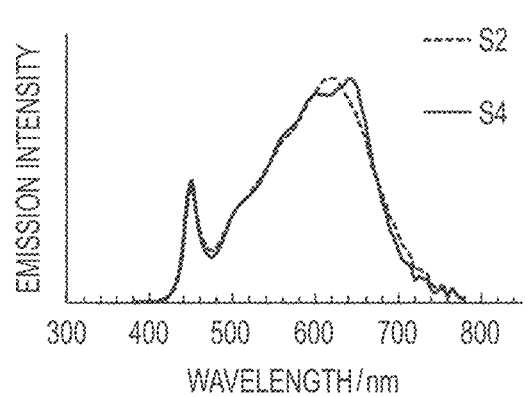
FIG. 8B shows charts illustrating simulated light emission characteristics of light-emitting devices in the examples.
Figure 8C:
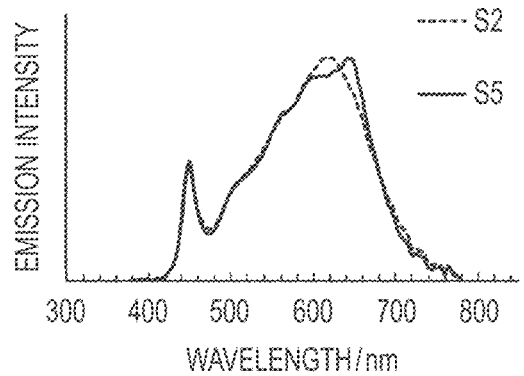
FIG. 8C shows charts illustrating simulated light emission characteristics of light-emitting devices in the examples.
Figure 8D:
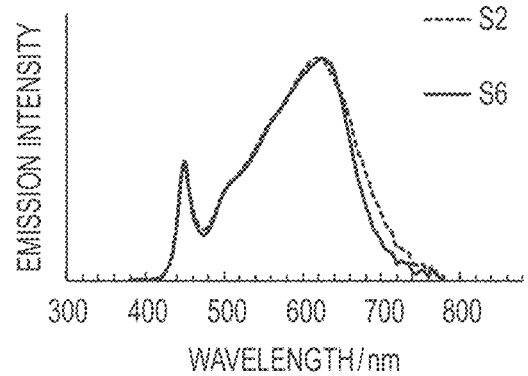
FIG. 8D shows charts illustrating simulated light emission characteristics of light-emitting devices in the examples.
Figure 8E:
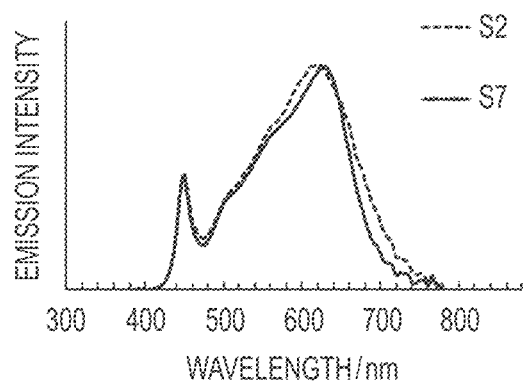
FIG. 8E shows charts illustrating simulated light emission characteristics of light-emitting devices in the examples.
Figure 8F:
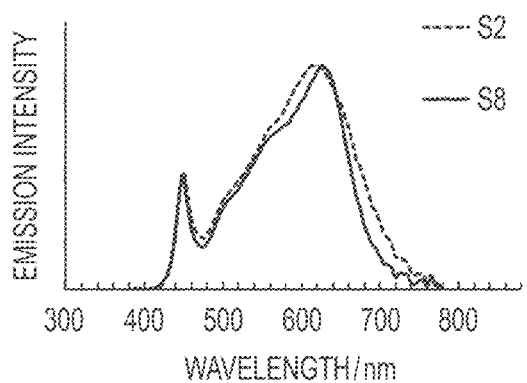
FIG. 8F shows charts illustrating simulated light emission characteristics of light-emitting devices in the examples.
Figure 8G:
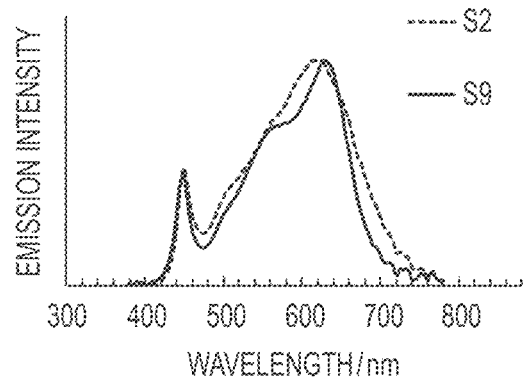
FIG. 8G shows charts illustrating simulated light emission characteristics of light-emitting devices in the examples.

Reflectance A: Minimum reflectance from emission peak wavelength to 800 nm
Reflectance B: Minimum reflectance from emission peak wavelength to (emission peak wavelength—50 nm)
Reflectance C: Minimum reflectance from 400 nm to 550 nm XRD patterns of the phosphors in examples 4-10 are shown in FIG. 3. Emission spectra of the phosphors in examples 4-9 and comparative example 1 are shown in FIG. 4A and emission spectra of the phosphors in examples 10-12 and comparative example 1 are shown FIG. 4B. Normalized emission spectra of the phosphors in examples 4, 5, and 9 and reference example 1 when emission peak intensity of the phosphors is defined as 1 are shown in FIG. 5. In addition, the reflectance spectra of the phosphors of each of the examples and the comparative example are shown in FIGS. 6A-D. The relationships of the relative emission intensities of the phosphors of each of the examples with [reflectance A−reflectance B], [reflectance A−reflectance C], [reflectance C/reflectance A] and [reflectance B/reflectance A], associated with the reflectances A, B and C, are shown in FIGS. 7A-D. Note that the emission peak wavelength of the phosphor of reference example 1 was 646 nm and the full width at half maximum was 87 nm.

As shown in above examples, the phosphor of some embodiments can achieve various emission peak wavelengths to match an application by adjusting the composition. In addition, the phosphors of each example all exhibited extremely high emission intensity as compared to the phosphor of comparative example 1.

In addition, the full width at half maximum of the phosphors of each example was extremely narrow as compared to the phosphor of reference example 1, and by using such a phosphor, a light-emitting device having both favorable conversion efficiency and color rendering or color reproducibility can be provided.

Next, results S1-S9 of simulations according to the characteristics of a light-emitting device comprising the phosphor of the present embodiment are described.

Assuming a SCASN phosphor having an emission peak wavelength of 620 nm (BR-102/D, manufactured by Mitsubishi Chemical Corporation) is used as a first red phosphor, a phosphor of the examples and the comparative example shown in Table 3 below or a CASN phosphor having an emission peak wavelength of 646 nm (BR-101/J, manufactured by Mitsubishi Chemical Corporation) is used as a second red phosphor, and a LuAG phosphor (BG-801/B4, manufactured by Mitsubishi Chemical Corporation) is used as a green phosphor, the emission spectra of white LEDs comprising each of the phosphors were calculated on the basis of information for the emission spectrum, the internal quantum efficiency (iQE), and the like of each phosphor. All simulations were carried out assuming a blue LED chip emitting light of 449 nm. In addition, once the color rendering index Ra satisfies 90 or more, the amounts of the green phosphor and the first and second red phosphors were adjusted such that chromaticity coordinates match the coordinates of 3000 K white light on the Planck curve, and characteristics were compared. Results are shown in FIGS. 8A-G. In addition, Table 3 shows the results of finding the color rendering index Ra, the red color rendering index R9, and the conversion efficiency (LER) from each spectrum.

Note that "Phosphor Mass Relative Value" in Table 3 is a mass ratio of each phosphor when the total mass of each phosphor is treated as 100%. "Green" is the LuAG phosphor described above, "Red 1" is the first red phosphor described above, and "Red 2" is the second red phosphor described above.

[Table 3]

TABLE 3

| | Green phosphor | First red phosphor | Second red phosphor | Relative value of phosphor mass | | | LER | Ra | R9 |
|---|---|---|---|---|---|---|---|---|---|
| | | | | Green | Red 1 | Red 2 | Lm/W$_{opt}$ | | |
| S1 | LuAG | SCASN | Comparative example 1 | 72% | 0% | 28% | 358 | 58 | — |
| S2 | LuAG | SCASN | Reference example 1 | 80% | 6% | 14% | 295 | 91 | 53 |

TABLE 3-continued

| | Green phosphor | First red phosphor | Second red phosphor | Relative value of phosphor mass | | | LER | | |
| | | | | Green | Red 1 | Red 2 | Lm/W$_{opt}$ | Ra | R9 |
|---|---|---|---|---|---|---|---|---|---|
| S3 | LuAG | SCASN | Example 2 | 72% | 8% | 20% | 311 | 90 | 50 |
| S4 | LuAG | SCASN | Example 3 | 81% | 7% | 11% | 297 | 90 | 57 |
| S5 | LuAG | SCASN | Example 4 | 82% | 9% | 9% | 294 | 91 | 61 |
| S6 | LuAG | SCASN | Example 6 | 76% | 9% | 14% | 311 | 91 | 50 |
| S7 | LuAG | SCASN | Example 7 | 69% | 6% | 24% | 310 | 92 | 59 |
| S8 | LuAG | SCASN | Example 8 | 63% | 4% | 33% | 311 | 92 | 61 |
| S9 | LuAG | SCASN | Example 9 | 49% | 0% | 51% | 312 | 90 | 63 |

As shown in Table 3, the light-emitting devices using the phosphors of each example had dramatically improved color reproducibility Ra as compared to a case using the phosphor of comparative example 1, and in addition, LER or R9 or both are improved compared to a case using the phosphor of reference example 1, and conversion efficiency and color rendering or color reproducibility as well are superior. Note that in the example using the phosphor of comparative example 1 for the second red phosphor, the emission intensity of the red region was low and therefore the value of R9 indicating the degree of color reproduction of red was extremely low and could not be evaluated accurately.

As indicated above, according to some embodiments, a phosphor can be provided having a favorable emission peak wavelength, narrow full width at half maximum, and/or high emission intensity, and by including the phosphor, a light-emitting device, an illumination device, an image display device, and/or an indicator lamp for a vehicle having favorable color rendering, color reproducibility and/or favorable conversion efficiency can be provided.

Although various embodiments are explained with reference to the drawings as described above, the present invention is not limited to the embodiments. It is clear that the person skilled in the art can conceive various examples of changes and modifications within the scope of claims and it is understood that such examples of changes and modifications are of course included in a technical scope of the present invention. Additionally, each constituent in the above embodiment can be arbitrarily combined within the scope of the gist of the invention.

The present application is based on a Japanese Patent Application No. 2022-007317 filed on Jan. 20, 2022 and a Japanese Patent Application No. 2022-007319 filed on Jan. 20, 2022, the contents of which are incorporated herein by reference.

INDUSTRIAL APPLICABILITY

Since the light-emitting device in the present invention is superior in color rendering, color reproducibility and/or conversion efficiency, the light-emitting device can be suitably used for an illumination device, an image display device, and an indicator lamp for a vehicle.

The invention claimed is:
1. An illumination device, comprising a light-emitting device as a light source,
wherein the light-emitting device comprises a first light emitter and a second light emitter that emits visible light due to irradiation with light from the first light emitter, and the second light emitter includes a phosphor that includes a crystal phase having a composition represented by formula [1] below,

$Re_xMA_aMB_bMC_cN_dX_e$      [1]

wherein in formula [1] above,
MA includes one or more elements selected from the group consisting of Sr, Ca, Ba, Na, K, Y, Gd, and La,
MB includes one or more elements selected from the group consisting of Li, Mg, and Zn,
MC includes one or more elements selected from the group consisting of Al, Si, Ga, In, and Sc,
X includes one or more elements selected from the group consisting of F, Cl, Br, and I,
Re includes one or more elements selected from the group consisting of Eu, Ce, Pr, Tb, and Dy, and
a, b, c, d, e, and x satisfy the following expressions, respectively,
$0.7 \leq a \leq 1.3$
$0.7 \leq b \leq 1.3$
$2.4 \leq c \leq 3.6$
$3.2 \leq d \leq 4.8$
$0.0 \leq e \leq 0.2$
$0.0 < x \leq 0.2$,
wherein a minimum reflectance of the phosphor in a prescribed wavelength region is 20% or more, and the prescribed wavelength region is a region from the emission peak wavelength of the phosphor to 800 nm, and
wherein the phosphor has a short emission peak wavelength of from 620 to 648 nm in an emission spectrum.

2. The illumination device according to claim 1 wherein, in formula [1], 80 mol % or more of MA is one or more elements selected from the group consisting of Sr, Ca, and Ba.

3. The illumination device according to claim 1 wherein, in formula [1], 80 mol % or more of MB is Li.

4. The illumination device according to claim 1 wherein, in formula [1], 80 mol % or more of MC is at least one selected from the group consisting of Al and Ga.

5. The illumination device according to claim 1 wherein a space group of the crystal phase having the composition represented by formula [1] is P-1.

6. The illumination device according to claim 1 wherein a full width at half maximum (FWHM) in an emission spectrum of the phosphor is 70 nm or less.

7. The illumination device according to claim 1, further comprising a yellow phosphor and/or a green phosphor.

8. The illumination device according to claim 7 wherein the yellow phosphor and/or green phosphor include at least one phosphor selected from the group consisting of a garnet type phosphor, a silicate type phosphor, a nitride phosphor, and an oxynitride phosphor.

* * * * *